(12) United States Patent
Kunikiyo

(10) Patent No.: US 6,461,796 B1
(45) Date of Patent: Oct. 8, 2002

(54) METHOD OF MANUFACTURING A SEMICONDUCTOR DEVICE

(75) Inventor: Tatsuya Kunikiyo, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/409,353

(22) Filed: Sep. 30, 1999

(30) Foreign Application Priority Data

Apr. 28, 1999 (JP) ............................................. 11-121408

(51) Int. Cl.[7] ........................ H01L 21/8239; G03C 5/50; G03C 5/56
(52) U.S. Cl. ........................ 430/313; 430/315; 430/324; 438/217; 438/238; 438/254
(58) Field of Search ................................ 430/313, 315, 430/324; 438/217, 238, 254

(56) References Cited

U.S. PATENT DOCUMENTS 4,767,721 A * 8/1988 Liao et al. ..................... 437/34
5,527,662 A * 6/1996 Hashimoto et al. .......... 430/296

OTHER PUBLICATIONS

A Novel Double Well with Buffer N⁻ and P⁺ Gettering Layers for Suppression of Soft Error Rate (DOWNSER), S. Komori et al., 1994 Symposium on VLSI Technology Digest of Technical Papers, pp. 41–42.

"Highly Reliable Double Well in Thin–p⁻ on p⁺ Epitaxial Wafer for Logic–Embedded DRAM", Y. Yamashita et al., IEDM Technology Digest, 1996, pp. 673–676.

* cited by examiner

*Primary Examiner*—Mark F. Huff
*Assistant Examiner*—Daborah Chacko-Davis
(74) *Attorney, Agent, or Firm*—McDermott, Will & Emery

(57) ABSTRACT

Disclosed is a method of manufacturing a semiconductor device includes the steps of: forming a first resist mask having an opening portion of a specific pattern on a semiconductor substrate, the opening portion having a side wall formed with a taper portion; forming a water-soluble resist film on the first resist mask in such a manner as to cover at least the taper portion, the water-soluble resist film being made water-insoluble when it reacts with acid; allowing the water-soluble resist film to react with acid, to form a water-insoluble portion on the taper portion; removing the water-soluble resist film while leaving the water-insoluble portion, to form a second resist mask composed of the water-insoluble portion formed on the taper portion and the first resist mask; and implanting an impurity in the semiconductor substrate via the second resist mask, to form an impurity region in the semiconductor substrate.

9 Claims, 12 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device using a photolithography technique and, more particularly, to a method of manufacturing a semiconductor device, including a step of forming wells in a semiconductor substrate using the photolithography technique.

2. Description of the Background Art

A so-called lithography technique of forming or mass producing patterns of miniaturized devices or circuits by making use of materials sensitive to light or radiation, has been used in a process of manufacturing semiconductor devices, typically semiconductor integrated circuits.

A process of forming a triple well structure as one example of the process of manufacturing a semiconductor devices using the photolithography technique will be described below. The triple well structure is characterized in that an N well and a P well are provided in a surface layer of a semiconductor substrate in such a manner as to be adjacent to each other, and a bottom N well (hereinafter, referred to as "BN well") is provided on the underside of the P well. The BN well is provided for preventing latch up caused by a pnpn thyristor circuit formed when a transistor is formed on the wells provided in the surface layer of the semiconductor substrate. In addition, the BN well may be formed not on the underside of the P well but on the underside of the N well.

FIGS. 20 to 23 are partial sectional views illustrating steps of forming the above-described triple well structure. First, as shown in FIG. 20, an underlying film 102, typically a silicon oxide film is formed on a semiconductor substrate 101 and an N well 103 is formed in a surface layer of the semiconductor substrate 101 using the conventional lithography technique. Then, an acid generating chemical amplification resist film 106 of positive type is formed on the semiconductor substrate 101.

The acid generating chemical amplification resist film 106 is made from a resist containing an acid generating agent and an alkali-soluble resin to which a solution suppressing base is introduced. In a case where the positive type acid generating chemical amplification resist film is used, when the resist film is exposed to exposure rays, acid is generated in the resist film and the solution suppressing base is decomposed by the acid functioning as a catalyst, with a result that the resist film is made alkali-soluble; while, when the resist film is not exposed to exposure rays, since acid is not generated in the resist film, the resist film is left as alkali-insoluble.

Next, as shown in FIG. 21, using a mask having a non-mask region and a mask region, a portion of the resist film 106 positioned under the non-mask region of the mask is irradiated with monochromatic rays, to be made alkali-soluble. Then, the alkali-soluble portion of the resist film 106 is removed by subjecting to baking treatment and development treatment, thereby forming a resist mask 106.

At this time, there remains the resist film 106 under the mask region of the mask. Because of the effects of standing waves formed by monochromatic rays used as exposure rays as well as of such an uneven intensity distribution of the exposure rays that the intensity of the incident rays at the lower portion of the resist film is smaller than that at the upper portion of the resist film, as shown in FIG. 21, the side wall of the remaining portion of the resist film 106 is formed with a taper portion 106a, that is, a portion horizontally broadened toward the bottom. In this specification, the horizontal distance between the upper edge of the side wall and the bottom edge of the portion horizontally broadened from the side wall is hereinafter called the width of the taper. That is to say, the distance W shown in FIG. 21 is called the width of the taper.

After formation of such a resist mask 106, as shown in FIG. 22, ions of a P-type impurity such as boron are implanted in the surface layer of the substrate 101 via the resist mask 106, to form a P well 104, and then ions of an N-type impurity such as phosphorous are implanted in the surface layer of the substrate 101 at a higher energy using the resist mask 106, to form a BN well 105 on the underside of the P well 104. The resist mask 106 is then removed, to form a triple well structure shown in FIG. 23. Here, with respect to the BN well 105 thus formed, since the taper portion 106a is formed on the side wall of the resist mask 106 as described above, a portion curved upwardly (called a BN extension portion 105 is formed at the end portion, positioned under the taper 106a, of the BN well 105 as shown in FIG. 22.

At the above-described lithography step, as shown in FIG. 24, at a portion of the non-mask region where is separated a specific distance from the edge of the mask region of a mask 107, the exposure rays are allowed to pass therethrough in all directions without any cutoff by the mask 107. Accordingly, incident rays (for example, incident rays 108a and 108b) reach a bottom region 106b of the resist film 106 positioned under the above portion of the non-mask region.

On the other hand, at a portion of the non-mask region, near the edge of the mask region of the mask 107, the exposure rays traveling from the mask region side are not allowed to pass therethrough because of cutoff by the mask 107. Accordingly, the exposure rays traveling from the mask region side never reach a bottom region 106c of the resist film 106 positioned under the above portion of the non-mask region.

Further, since each incident ray radiated on the resist film 106 is absorbed in the resist film 106, the intensity of the incident ray becomes decayed along with the advance of the incident ray in the resist film 106. After all, the intensity of the incident ray, when it reaches the bottom of the resist film 106, becomes quite weak. While part of incident rays reaching the bottom of the resist film 106 is reflected thereby, the intensities of the reflected rays are very weak because the incident rays are decayed at the bottom of the resist film 106.

As is apparent from the above description, the bottom region 106b positioned under the portion of the non-mask region separated the specific distance from the edge of the mask region of the mask 107 receives the exposure rays in all directions although the intensities thereof are weaker than those at the upper portion of the resist film 106, and consequently the bottom region 106b of the resist film 106c an obtain the intensities of the exposure rays which are large enough to make the resist film 106 alkali-soluble.

On the contrary, the bottom region 106c positioned under the portion of the non-mask region near the edge of the mask region of the mask 107 receives only the exposure rays traveling in the limited directions, the intensities of the exposure rays being, as described above, weaker than those at the upper portion of the resist film 106, and consequently the bottom region 106c of the resist film 106 cannot obtain the intensities of the exposure rays which are enough to make the resist film 106 alkali-soluble.

As a result, the bottom region 106c of the resist film 106 positioned under the portion of the non-mask region near the edge of the mask region of the mask 107 is left as alkali-insoluble, and is not removed after development treatment. In this way, as shown in FIG. 21, the side wall of the resist film 106 is formed with the portion horizontally broadened toward the bottom, that is, the taper portion 106a.

When the resist film is irradiated with monochromatic rays, standing waves occur in the resist film by interference between the incident rays and the reflected rays from the surface of the semiconductor substrate. Since portions of the resist film corresponding to the middle of the nodes (called antinodes hereunder) of the standing waves are strongly sensitized and portions of the resist film corresponding to the nodes of the standing waves are weakly sensitized, the light exposure is repeatedly changed depending on the standing waves. As a result, irregularities are formed on the side wall of the resist mask depending on the unevenness of the light exposure.

A method of reducing such a width of the taper has been disclosed in Japanese Patent Laid-open No. Hei 4-239116, in which an underlying film having a thickness equivalent of $\lambda/4$ ($\lambda$: wavelength of the exposure rays) is formed on a semiconductor substrate. The underlying film sets the positions of an antinode of standing waves at the bottom of the resist film when incident rays are radiated at the right angle on the semiconductor substrate, thereby reducing the width of the taper formed on the side wall of the resist mask. Such a method, however, fails to obtain a sufficient effect because it directs attention only to the incident rays radiated at right angles on the substrate and it does not take the incident rays made incident obliquely on the substrate into account.

Further, it may be considered to set the best focus at the bottom of a resist film for reducing the width of the taper. According to this method, the intensities of exposure rays at the bottom of the resist film can be surely increased but the intensities of the exposure rays at the surface of the resist film are decreased because the surface of the resist film becomes defocused. In the case of a resist film having a large thickness, this method causes a problem that a portion to be exposed, near the surface of the resist film, cannot be sufficiently exposed to exposure rays, thus being left as alkali-insoluble. Accordingly, to develop the entire resist film so as to correspond to the mask, the best focus is generally set at a portion near the center of the thickness of a resist film. As a result, a taper portion may be formed on the side wall of a resist mask obtained from the resist film for the above reason.

If a taper portion is formed on the side wall of a resist mask, the shape of the actually formed resist mask is different from that of the designed resist mask to be produced. Namely, there is caused a problem such as formation of the above-described BN extension portion, resulting in that an impurity region cannot be formed as designed.

Another problem of the above-described BN extension portion is that a between-well breakdown voltage in the triple well structure differs depending on the presence or absence of the BN extension.

FIG. 25 is a view showing a triple well structure in which a BN well 105 is formed in a semiconductor substrate and a $P^+$ contact portion 109 is provided in an N well 103. FIG. 26 is a graph showing a relationship between the between-well breakdown voltage and the presence or absence of a BN extension portion on the BN well 105. In FIG. 26, the ordinate designates the breakdown voltage; the abscissa designates a distance ($\mu$m) between the contact portion and an adjacent portion of the wells 103 and 104; a solid line shows the breakdown voltage of the triple well structure in which the BN extension portion is formed; and a broken line shows the breakdown voltage of the triple well structure in which the BN extension portion is not formed.

As is apparent from FIG. 26, the between-well breakdown voltage differs depending on the presence or absence of the BN extension portion. Specifically, the minimum distance between the contact portion and the adjacent portion of the wells for assuring the maximum breakdown voltage becomes a1 (about 1.4 $\mu$m) for the triple well structure in which the BN extension portion is formed, and becomes a2 (about 0.4 $\mu$m) for the triple well structure in which the BN extension portion is not formed.

As described above, to assure the maximum breakdown voltage, the above minimum distance for the triple well structure in which the BN extension portion is formed must be made larger than that for the triple well structure in which the BN extension portion is not formed by a value of a1−a2 (about 1.4 $\mu$m−about 0.4 $\mu$m=1.0 $\mu$m in the above example). Accordingly, in the case of manufacturing a semiconductor device having a triple well structure required to assure the maximum breakdown voltage, if the BN extension portion is formed in the structure, the distance from the contact portion must be made larger than that for the case in which the BN extension portion is not formed, so that the chip area must be made correspondingly larger. This causes reduction in the theoretical number of chips to be manufactured per wafer, thereby increasing the manufacturing cost.

FIG. 27 shows a triple well structure in which a P well 104 is surrounded by N wells 103 as well as BN wells 105 are formed under the N wells 103, wherein BN extension portions 105a are formed on side walls of the BN wells 105, that is, on both sides of the P well 104. Even in this structure, like the above-described triple well structure, the between-well breakdown voltage for the structure in which the BN extension portions are formed is smaller than that for the structure in which they are not formed, and consequently, to assure the maximum between-well breakdown voltage, a distance A across the P well 104 for the structure in which the BN extension portions are formed must be made larger than that for the structure in which they are not formed.

FIG. 28 is a graph showing a relationship between the between-well breakdown voltage and the presence or absence of the BN extension portions in the structure shown in FIG. 27. In FIG. 28, the ordinate designates the breakdown voltage; the abscissa designates a distance ($\mu$m) between the contact portion and the adjacent portion of the wells; and the negative region of the distance A indicates a length of an area in which both the N wells 103 are overlapped to each other. In this negative region of the distance A, therefore, the entire region of the P well 104 is covered with both the N wells 103. In this graph, a solid line shows the breakdown voltage of the structure in which the BN extension portions are formed and a broken line shows the breakdown voltage of the structure in which the BN extension portions are not formed.

As is apparent from FIG. 28, the minimum distance between the contact portion and the adjacent portion of the wells for assuring the maximum breakdown voltage becomes a1 (about 2.4 $\mu$m) for the structure in which the BN extension portions are formed, and becomes a2 (about 1.4 $\mu$m) for the structure in which the BN extension portions are not formed.

As described above, to assure the maximum breakdown voltage, the above minimum distance for the structure in which the BN extension portions are formed must be made larger than that for the structure in which the BN extension portions are not formed by a value of a1−a2 (about 2.4 μm−about 1.4 μm=1.0 μm in the above example).

SUMMARY OF THE INVENTION

An object of the present invention is to provide a method of manufacturing a semiconductor device, which is intended to reduce the width of a taper formed on a side wall of a resist mask by utilizing a resist film having a property that a portion reacting with acid is made water-insoluble.

Another object of the present invention is to provide a method of manufacturing a semiconductor device, which enables accurate lithography by suppressing the width of a taper formed on a side wall of a resist film.

A further object of the present invention is to provide a method of manufacturing a semiconductor device, which is capable of reducing a between-well distance by preventing an extension portion from being formed on a side wall of a BN well.

The above objects of the present invention are achieved by a method of manufacturing a semiconductor device, including the steps of: forming a first resist mask having an opening portion of a specific pattern on a semiconductor substrate, the opening portion having a side wall formed with a taper portion; forming a water-soluble resist film on the first resist mask in such a manner as to cover at least the taper portion, the water-soluble resist film being made water-insoluble when it reacts with acid; allowing the water-soluble resist film to react with acid, to form a water-insoluble portion on the taper portion; removing the water-soluble resist film while leaving the water-insoluble portion, to form a second resist mask composed of the water-insoluble portion on the taper portion and the first resist mask; and implanting an impurity in the semiconductor substrate via the second resist mask, to form an impurity region in the semiconductor substrate.

Since the thickness of the remaining water-insoluble portion of the resist film is dependent on the shape of the under layer, i.e., the first resist mask, the thickness of the remaining portion of the resist film is larger at a location on the taper than at a location on the flat surface. Thus, According to the present invention, it is possible to make small the width of a taper formed on a side wall of the remaining portion of the resist film, i.e., on a side wall of the second resist.

The above objects of the present invention are also achieved by a method of manufacturing a semiconductor device, including the steps of: forming an underlying film on a semiconductor substrate; forming a resist film on the underlying film; exposing the resist film to exposure rays having a specific wavelength, to form a mask having a specific pattern; and implanting an impurity in the semiconductor substrate via the mask, to form an impurity region in the semiconductor substrate; wherein the thickness of the underlying layer is set such that upon exposure, a phase of an exposure ray reflected from the front surface of the underlying film in a specific direction is matched, at the front surface of the underlying film, with a phase of an exposure ray having been reflected from the bottom surface of the underlying film and passing through the front surface of the underlying film in the specific direction.

According to the present invention, it is possible to enhance the intensity of the exposure rays on the front surface of the underlying film, whereby the width of a taper formed on the side wall of the resist mask is sufficiently suppressed.

The above objects of the present invention are further achieved by a method of manufacturing a semiconductor device, including the steps of: forming an underlying film on a semiconductor substrate; forming a resist film on the underlying film; exposing the resist film to exposure rays, to form a mask having a specific pattern; and implanting an impurity in the semiconductor substrate via the mask, to form an impurity region in the semiconductor substrate; wherein the reflectance of the underlying film is set such that the bottom portion of the resist film is exposed to the exposure rays reflected from the underlying film upon exposure.

According to the present invention, it is possible to enhance the intensity of the exposure rays on the bottom portion of the resist film, and hence to suppress the width of a taper formed on a side wall of the resist mask.

The present invention is obtained as a result of experiments which are performed directing an attention to the property of the above described resist film that water-insoluble crosslinking portion is formed when crosslinking Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings.

First Embodiment

FIGS. 1 to 7 are schematic sectional views illustrating a process of manufacturing a semiconductor device according to a first embodiment.

Figure 1:
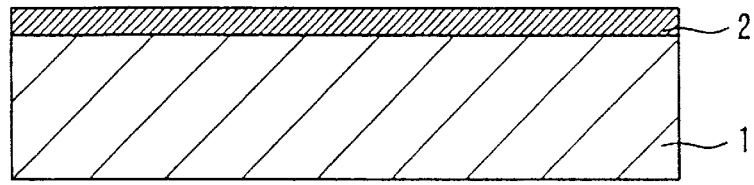
FIGS. 1 to 7 are schematic sectional views illustrating a process of manufacturing a semiconductor device according to a first embodiment of the present invention.

First, as shown in FIG. 1, an underlying film 2 such as a silicon oxide film is formed on a semiconductor substrate 1. The underlying film 2 is provided for preventing contamination of the surface of the semiconductor substrate 1 at the subsequent lithography step and ion implantation step.

Figure 2:
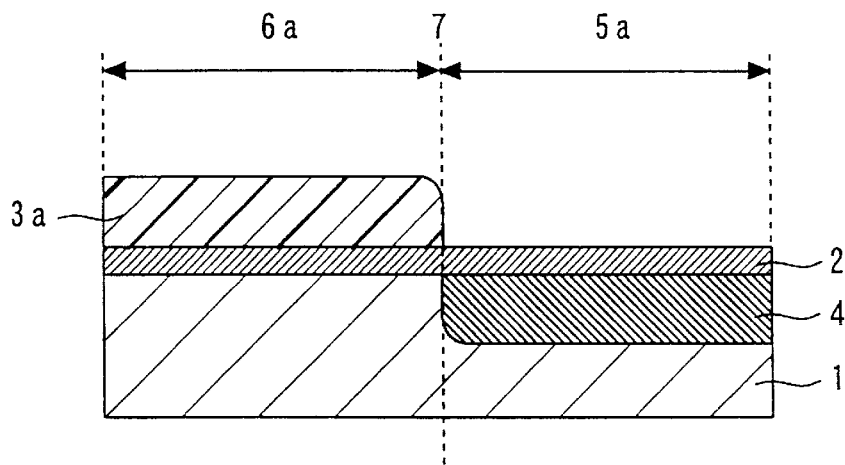

Next, as shown in FIG. 2, the underlying film 2 is coated with a positive type acid generating chemical amplification resist film 3a. Then, a mask (not shown) having a mask region 5a and a non-mask region 6a is provided. The resist film 3a is irradiated with monochromatic rays such as g-rays or i-rays of a mercury lamp, or KrF-rays of an excimer laser using the mask, to make alkali-soluble a portion of the resist film 3a positioned under the non-mask region 6a. The alkali-soluble portion of the resist film 3a is removed by subjecting to post baking treatment and development treatment, thereby forming a resist mask 3a having a specific pattern. Then, ions of phosphorous are implanted in the substrate 1 via the resist mask 3a under conditions with an accelerating voltage of 400 keV and a dose of $10^{13}$ ions/cm$^2$, to form an N well shown in FIG. 2. Since the resist film 3a may function as the resist mask used for forming the N well 4, the thickness of the resist film 3a may be set at a value in a range of about 1 to 3 μm.

Incidentally, the positive type acid generating chemical amplification resist film 3a is generally composed by introducing a solution suppressing base into acid generating agent and alkali-soluble resin. The positive type acid generating chemical amplification resist film 3a has a property that it generates an acid when being exposed to exposure rays. A solution suppressing base contained in the resist film 3a is decomposed by the acid functioning as catalyst, thereby the resist film 3a becomes alkali-soluble. On the contrast, when the resist film 3a is not exposed to exposure rays, since acid is not generated in the resist film 3a, the resist film 3a is left as insoluble in an alkali developer.

Figure 3:
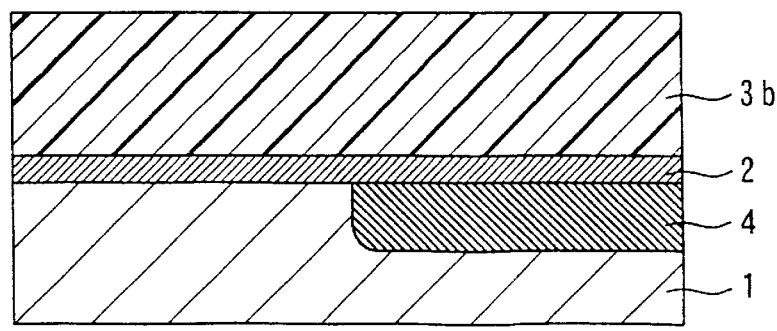

After formation of the N well 4, the resist mask 3a is removed by etching, and as shown in FIG. 3, the entire surface of the wafer is coated with a first resist film 3b. A positive type acid generating chemical amplification resist film is similarly used as the first resist film 3b; however, since the first resist film 3b is required to function as a resist mask used for forming a BN well by ion implantation at a higher energy, the thickness of the first resist film 3b must be sufficiently larger than that of the previous resist film 3a functioning as the resist mask used for forming the N well 4 by ion implantation at a lower energy. To be more specific, the thickness of the first resist film 3b may be generally in a range of about 1 to 5 μm, preferably, in a range of 2 to 3 μm.

Figure 4:
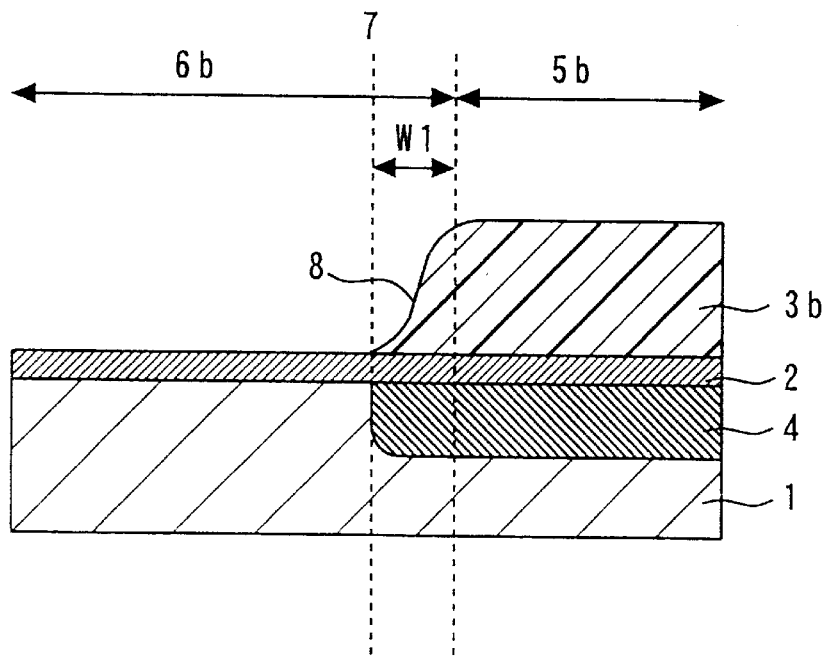

Next, as shown in FIG. 4, a mask (not shown) having a mask region 5b and a non-mask region 6b is prepared. It should be noted that the mask is formed such that the edge of the mask region is offset from a side wall portion 7 of the N well 4 toward inside the same by the width of a taper to be formed on a resist mask 3b later for making small a between-well distance. The first resist film 3b is irradiated with monochromatic rays (wavelength: 248 nm) emitted from a KrF excimer laser using the mask prepared as described above, whereby a portion of the first resist film 3b positioned under the non-mask region 6b is exposed to the monochromatic rays, to be thus made alkali-soluble. In addition, since the first resist film 3b is of the positive type like the resist film 3a, only the portion exposed to exposure rays becomes alkali-soluble. The alkali-soluble portion of the first resist film 3b is removed by subjecting to post baking treatment and development treatment using an alkali developer, thereby forming a first resist mask 3b having a specific pattern.

As shown in FIG. 4, a taper portion 8 is formed on a side wall of the first resist mask 3b. The width W1 of the taper portion 8, which is dependent on the thickness of the first resist film 3b, becomes larger as the thickness of the first resist film 3b is set at a greater value. More particularly, the width W1 becomes as large as about 500 to 1000 Å when the first resist film 3b has the thickness as described above. Accordingly, if a BN well is formed using the first resist mask 3b, an extension portion is formed on a side wall of the BN well by the effect of the taper portion 8. To cope with such an inconvenience, according to this embodiment, a second resist mask having a small width of a taper is formed for suppressing the formation of the extension portion. A method of forming the second resist mask used for forming the BN well will be described below.

Figure 5:
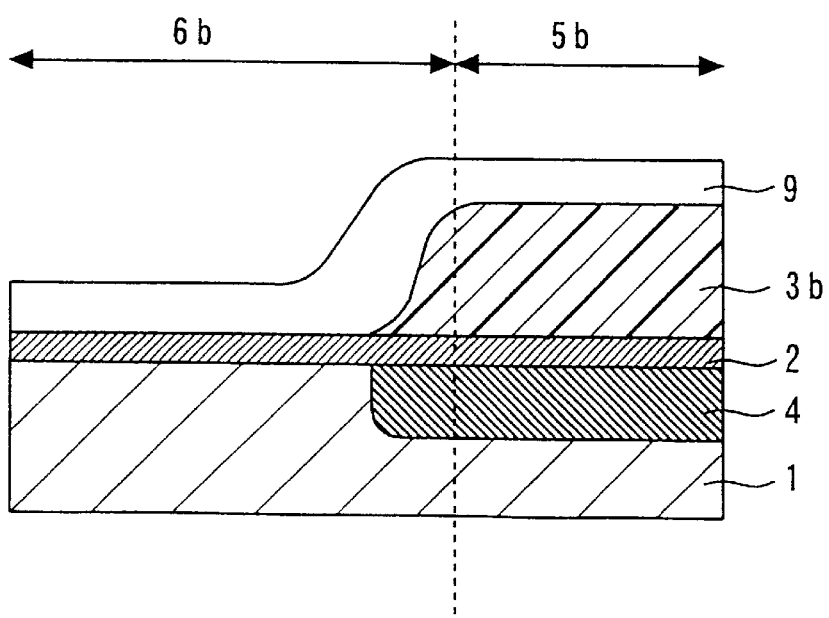

After the formation of the first resist mask 3b in the described manner, as shown in FIG. 5, the entire surface of the semiconductor substrate 1 on which the first resist mask (acid generating chemical amplification resist) 3b has been formed is uniformly coated with a second resist film 9. Here, the second resist film 9 is made from a mixture of a water-soluble resin and a water-soluble crosslinking agent. The mixture has a characteristic that a crosslinking reaction occurs under the presence of acid functioning as catalyst. To be more specific, before reacting with acid, the mixture is kept in the non-crosslinking state and is soluble in water, particularly in alkali, and when acid is brought in contact with part of the mixture, only a crosslinking portion of the mixture formed by the crosslinking reaction with acid functioning as catalyst becomes water-insoluble, particularly alkali-insoluble.

Specific examples of the above-described water-soluble resins may include polyacrylic acid, polyvinyl acetal, polyvinyl pyrrolidone, polyvinyl alcohol, polyethylene imine, polyethylene oxide, styrene-maleic anhydride copolymer, polyvinylamine, polyallyl amine, a water-soluble resin containing an oxazoline base, a water-soluble melamine resin, a water-soluble urea resin, an alkyd resin, and sulfonamide.

Specific examples of the above-described water-soluble crosslinking agents may include a melamine based crosslinking agent, a urea based crosslinking agent, and an amino based crosslinking agent. A melamine derivative or a methylolmelamine derivative may be used as the melamine based crosslinking agent. A urea derivative, a methylolurea derivative, ethylene urea carboxylic acid, or a methylolethylene urea derivative may be used as the urea based crosslinking agent. Benzoguanamine, glycoluril or isocyanate may be used as the amino based crosslinking agent. In particular, from the viewpoint of stability in crosslinking reaction under the presence of acid functioning as catalyst, a mixture of a water-soluble melamine resin (water-soluble resin) and a melamine derivative (crosslinking agent) may be preferably used.

The thickness of the second resist film 9 may be generally in a range of 10 to 100 Å. In consideration of the condition of crosslinking reaction and the position at which a crosslinking portion is formed, it is preferably in a range of 30 to 50 Å.

After formation of the second resist film 9 on the first resist mask 3b, the substrate 1 is subjected to baking treatment. At this time, acid contained in the acid generating chemical amplification resist which forms the first resist mask 3b is thermally diffused from the first resist mask 3b to the second resist film 9 as shown by arrows in FIG. 6, and the acid thus diffused reacts with the second resist film 9. The reaction between the acid and the second resist film 9 causes crosslinking reaction under the presence of the acid functioning as catalyst, to form a crosslinking portion 9a which becomes water-insoluble. On the other hand, since a portion of the second resist film 9 directly formed on the underlying film 2 is not in contact with the first resist film 3b, it does not receive acid. That is to say, since crosslinking reaction does not occur in such a portion (non-crosslinking portion) 9b of the second resist film 9, the portion 9b is left as water-soluble.

Figure 6:
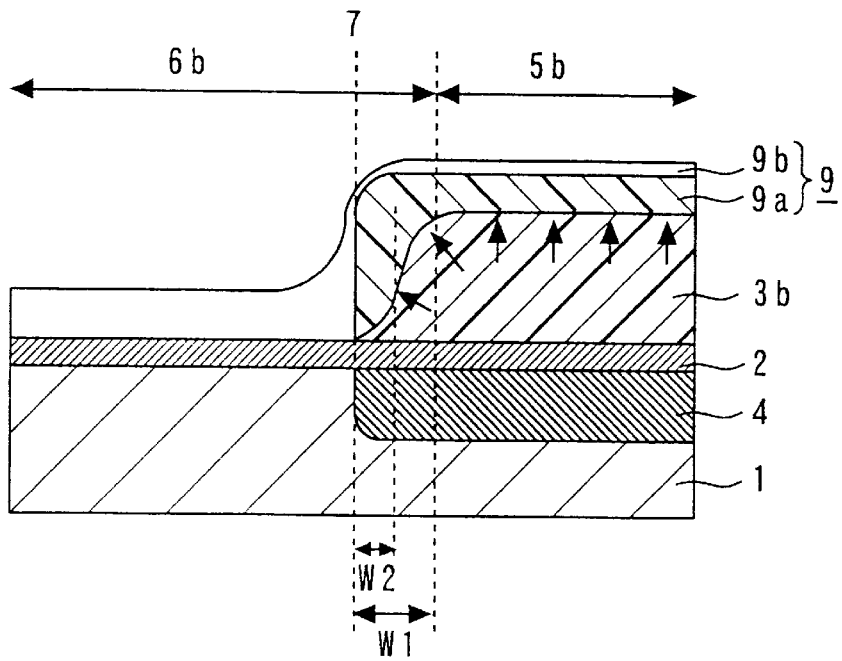

Accordingly, when the substrate 1 is subjected to development treatment using an alkali developer, as shown in FIG. 6, only the crosslinking portion 9a of the second resist film 9 remains and the non-crosslinking portion 9b is removed, to thereby form a second resist mask composed of the first resist mask 3b and the remaining crosslinking portion 9a. With respect to the second resist mask, the crosslinking portion 9a is formed on the first resist mask 3b. Thus, the width of a taper formed on the second resist mask becomes, as shown in FIG. 6, W2 which is smaller than W1.

As an experimental result, it is confirmed that the thickness of the remaining crosslinking portion 9a is larger at a location on the taper than at a location on the flat surface. This means that the thickness of the remaining crosslinking portion is dependent on the shape of the under layer. In this embodiment, by making use of such a characteristic, the width of a taper formed on the second resist mask can be reduced.

The temperature of the above baking treatment must be set at a value allowing thermal diffusion of the acid from the acid generating chemical amplification resist forming the first resist mask 3b to the second resist film 9. Since acid can be sufficiently diffused at a usual baking temperature, the temperature of the above baking treatment may be set in a range of 100 to 150° C. In this embodiment, the baking treatment is performed at about 115° C. for one minute.

In addition, since the edge of the mask region 5b of the mask (not shown) is offset inwardly from the side wall portion 7 of the N well 4 by the width W1 of the taper as explained in the step of forming the first resist mask 3b, the second resist mask can be formed at the time when crosslinking portion 9a is remained on the first resist mask 3b such that a side wall of the second resist mask substantially corresponds to the previously designed mask edge.

Figure 7:
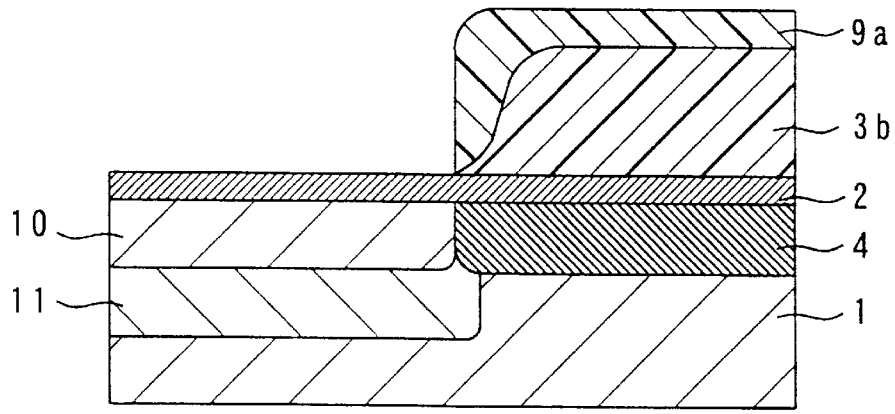

After formation of the second resist mask, ions of boron are implanted in the substrate 1 via the second resist mask under conditions with an accelerating voltage of 300 keV and a dose of $10^{13}$ ions/cm$^2$, to form a P well 10. Then, ions of phosphorous are implanted in the substrate 1 via the second resist mask under conditions with a high accelerating voltage of 2 MeV and a dose of $10^{13}$ ions/cm$^2$, to form a BN well 11 on the underside of the P well 10. In the structure thus obtained, since the width of the taper formed at the side wall of the second resist mask is small, an extension portion is little formed on the BN well as shown in FIG. 7.

According to the method of manufacturing a semiconductor device in this embodiment, the second resist film causing a crosslinking reaction by reaction with acid is formed on the first acid generating chemical amplification resist having at its side wall a taper portion. A crosslinking portion of the second resist film is formed by a crosslinking reaction between the second resist film and acid generated from the first resist film. A non-crosslinking portion of the second resist film not causing any crosslinking reaction is removed, to form a resist mask composed of the first resist film and the crosslinking portion of the second resist film. According to the above described method, the width of a taper portion formed at a side wall of the resist mask is made small and an accuracy pattern is formed in the substrate.

Further, according to the method in this embodiment, a large BN extension portion is not formed at a side wall of a BN well. Accordingly, in the case of manufacturing a semiconductor device having a triple well structure required to assure the maximum between-well breakdown voltage, it is possible to reduce the minimum distance between an element and an adjacent portion of wells, and hence to reduce the chip area of the semiconductor device.

Incidentally, the method described above is obtained as a result of experiments which are performed directing an attention to the point that the above described resist film forms water-insoluble crosslinking portions when reacting with acid functioning as catalyst.

In addition, a manufacturing method of a semiconductor device including the steps of forming a resist mask comprising a first resist mask and crosslinking portions, and performing an etching treatment using the resist mask to open a contact hole having a small diameter has been known in Japanese patent application Laid open No. Hei10-73927, although whose purpose does not corresponds to that of the first embodiment, i.e., reducing the width of the taper of the second resist mask.

Second Embodiment

In the first embodiment, the first resist mask is made from the acid generating chemical amplification resist and the second resist film is allowed to react with acid contained in the acid generation chemical amplification resist. The acid generating chemical amplification resist, however, is not necessarily used at the lithography step. For example, a resist containing no acid (generating no acid) is sometimes used depending on applications, for example, at the lithography step adopting an i-ray stepper. In this case, since the first resist contains no acid, it becomes impossible to make use of the characteristic of the second resist film in the manner described in the first embodiment.

In the case of mask patterning at the well forming step, the pattern to be formed is large. Thus, it is not necessary to adopt an expensive resist used for exposure by KrF rays. If the width of a taper formed at a side wall of a resist mask can be reduced by using a combination of a resist film used for exposure by i-rays and the above-described second resist film, it is possible to reduce the manufacturing cost. From this viewpoint, in this embodiment, after formation of the first resist mask made from the resist film used for exposure by i-rays, acid is supplied on the first resist mask or acidic ions are implanted in the second resist film. With this configuration, even if the resist forming the first resist mask does not contain acid, the second resist film is allowed to react with acid. Such a method will be described below.

First, the method of allowing the second resist film to react with acid by supplying acid on the first resist mask will be described. An N well is formed in a surface layer of a semiconductor substrate and then a first resist mask having a specific pattern is formed on the semiconductor substrate in accordance with the same manner as that described in the first embodiment. The first resist mask is made from not a resist generating acid but a resist generating no acid, for example, an i-ray resist such as novolac-naphthoquinonediazide based positive type photoresist. Then, the first resist mask is coated with acid or dipped in an acidic solution, to form acid on the first resist mask. In addition, carboxylic acid based low molecular acid may be preferably used for the above acid. Subsequently, a second resist film is formed on the first resist mask in the same manner as described in the first embodiment to form a crosslinking portion, whereby a second resist mask composed of the first resist mask and the crosslinking portion is formed. The other configuration is the same as that of the first embodiment, and therefore, the description thereof is omitted.

Next, the method of allowing the second resist film to react with acid by implanting acidic ions in the second resist film will be described below. An N well is formed in a surface layer of a semiconductor substrate and then a first resist mask and a second resist film are sequentially formed on the semiconductor substrate in accordance with the same manner as that described in the first embodiment. The first resist mask is made from not a resist generating acid but a resist generating no acid, for example, an i-ray resist such as novolac-naphthoquinonediazide based positive type photoresist. Then, to allow the second resist film to react with acid, acidic ions are implanted in the second resist film by using an ion implantation system or a FIB (Focused Ion Beam) system. Hydrogen ions $H^+$ may be preferably used as the acidic ions to be implanted. The other configuration is the same as that of the first embodiment, and therefore, the description thereof is omitted.

Preferably, the above acid or acid ions may be selectively supplied to the second resist film using a mask when they are implanted.

The above acid or acidic ions, however, can be supplied to the second resist film without use of the mask. In this case, when the substrate is subjected to baking treatment, for example, at 115° C. after the acid is supplied to the second resist film, the entire surface of the second resist film reacts with the acid, unlike the first embodiment in which only the portion of the second resist film positioned on the first resist film reacts with the acid. As a result, although the width of a taper formed at a side wall of the second resist mask composed of the first resist mask 3b and the crosslinking portion 9a formed thereon can be reduced like the first embodiment (see FIG. 6), a crosslinking portion is also formed at a portion of the second resist film 9 positioned under the non-mask region 6b unlike the first embodiment. Such a problem, however, can be solved by increasing, upon implantation of ions of an impurity, the implantation energy to such an extent that the ions can pass through the crosslinking portion in the non-mask region.

According to the method of manufacturing a semiconductor device in this embodiment, since acids or acidic ions are supplied to the second resist film to allow the second resist film to react with the acid, it is easy to control the amount of the acid supplied to the second resist film, and to reduce a variation in dimension of a crosslinking portion formed by reaction with the acid. Accordingly, the method in this embodiment is suitable for mass-production.

Third Embodiment

In a method of manufacturing a semiconductor device in the third embodiment, the lithography step for forming a resist mask used for forming a BN well is improved such that a phase of an exposure ray reflected from the front surface of an underlying film in a specific direction is matched, at the front surface of the underlying film, with a phase of an exposure ray having been reflected from the bottom surface of the underlying film and passing through the front surface of the underlying film in the specific direction. The method will be described below.

FIGS. 8 to 13 are schematic sectional views illustrating a process of manufacturing a semiconductor device according to the third embodiment.

Figure 8:
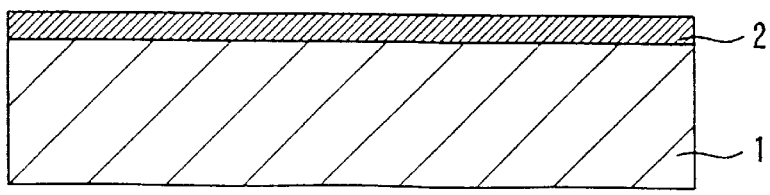
FIGS. 8 to 14 are schematic sectional views illustrating a process of manufacturing a semiconductor device according to the third embodiment of the present invention.

First, as shown in FIG. 8, an underlying film 2 such as a silicon oxide film is formed on a semiconductor substrate 1. The thickness of the underlying film 2 will be described later. The underlying film 2 is provided for preventing contamination of the surface of the semiconductor substrate 1 at the subsequent lithography step and ion implantation step.

Figure 9:
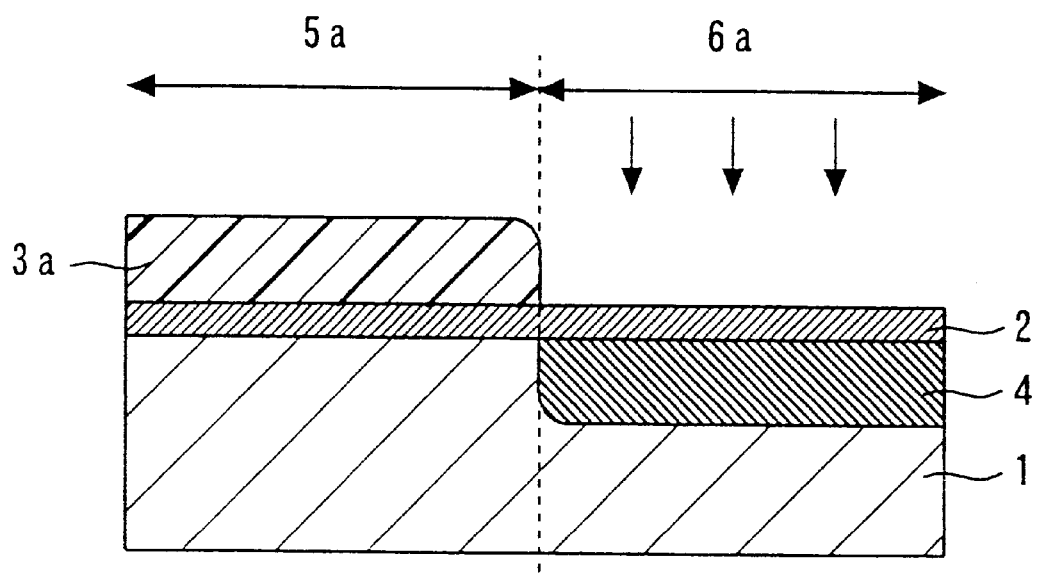

Next, as shown in FIG. 9, the underlying film 2 is coated with a positive type acid generating chemical amplification resist film 3a. Then, the resist film 3a is irradiated with monochromatic rays such as g-rays (wavelength: 436 nm) or i-rays (wavelength: 365 nm) of a mercury lamp, or KrF-rays (wavelength: 248 nm) of an excimer laser using a mask (not shown) having a mask region 5a and a non-mask region 6a, to make alkali-soluble a portion of the resist film 3a positioned under the non-mask region 6a. The alkali-soluble portion of the resist film 3a is removed by subjecting to post baking treatment and development treatment using an alkali developer, thereby forming a resist mask 3a having a specific pattern. Then, ions of phosphorous are implanted in the substrate 1 via the resist mask 3a under conditions with an accelerating voltage of 400 keV and a dose of $10^-$ ions/cm$^2$, to form an N well shown in FIG. 9. In addition, since the resist film 3a may function as the resist mask used for forming the N well 4, the thickness of the resist film 3a may be set at a value in a range of about 1 to 3 μm.

Figure 10:
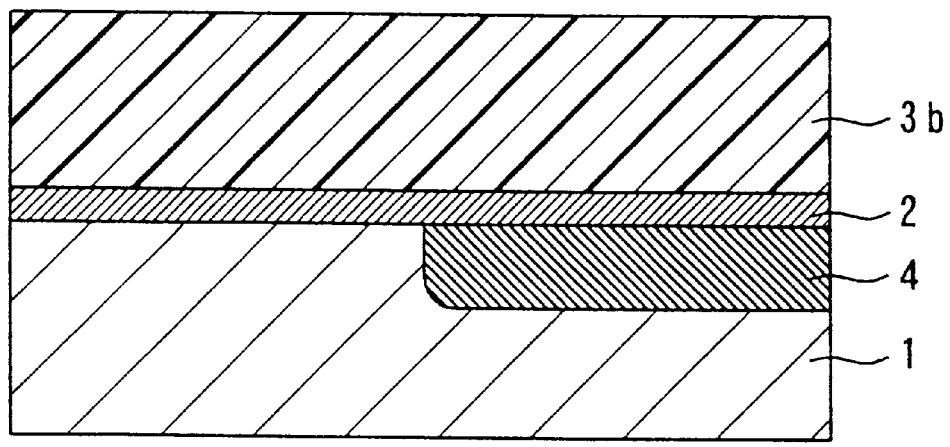

After formation of the N well 4, the resist mask 3a is removed by etching, and as shown in FIG. 10, the entire surface of the semiconductor substrate is coated with a positive type acid generating chemical amplification resist film 3b. Since the resist film 3b is required to function as a resist mask used for forming a BN well by ion implantation at a higher energy, the thickness of the resist film 3b must be sufficiently larger than that of the previous resist film 3a functioning as the resist mask used for forming the N well 4 by ion implantation at a lower energy. To be more specific, the thickness of the resist film 3b may be generally in a range of about 1 to 5 μm, preferably, in a range of 2 to 3 μm.

Figure 11:
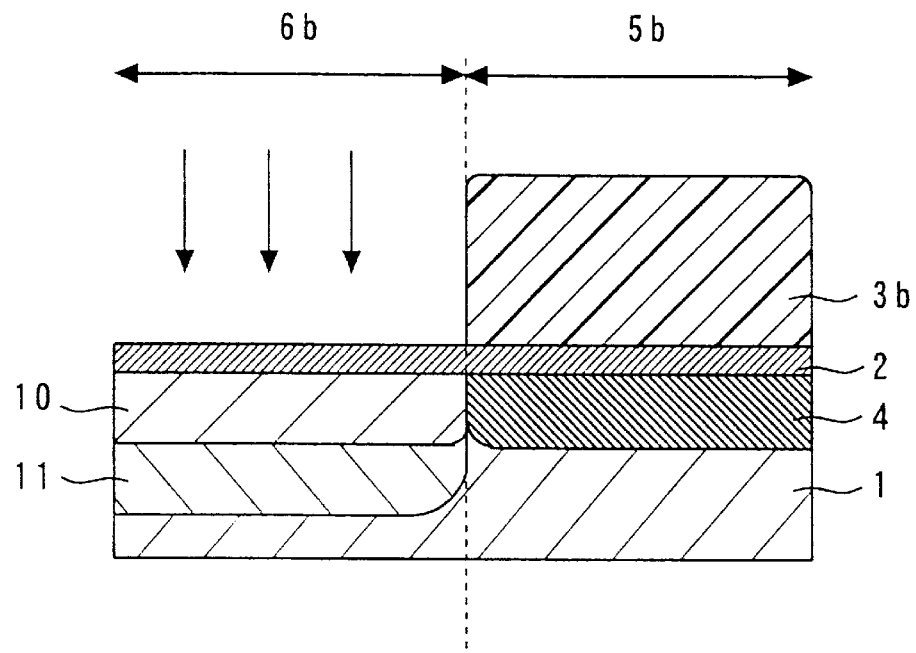

Next, as shown in FIG. 11, a mask (not shown) having a mask region 5b and a non-mask region 6b is prepared. Then, the resist film 3b is irradiated with monochromatic rays (wavelength: 248 nm) emitted from a KrF excimer laser using the ask prepared as described above, whereby a portion of the resist film 3b positioned under the non-mask region 6b is exposed to the monochromatic rays, to be thus made alkali-soluble. In addition, since the resist film 3b is of the positive type like the resist film 3a, only the portion exposed to exposure rays becomes alkali-soluble. The alkali-soluble portion of the resist film 3b is removed by post baking treatment and development treatment using an alkali developer, thereby forming a resist mask 3b having a specific pattern.

In this embodiment, upon the above exposure, a phase of an exposure ray reflected from the front surface of the underlying film in a specific direction is matched, at the front surface of the underlying film, with a phase of an exposure ray having been reflected from the bottom surface and passing through the front surface of the underlying film in the specific direction. To be more specific, at the step of forming the underlying film 2 described with reference to FIG. 8, the thickness of the underlying film 2 is set at such a specific value as to match the phases of both the above exposure rays with each other. The method of setting the thickness of the underlying film 2 at such a specific value as to match the phases of both the above exposure rays with each other will be described below.

Figure 12:
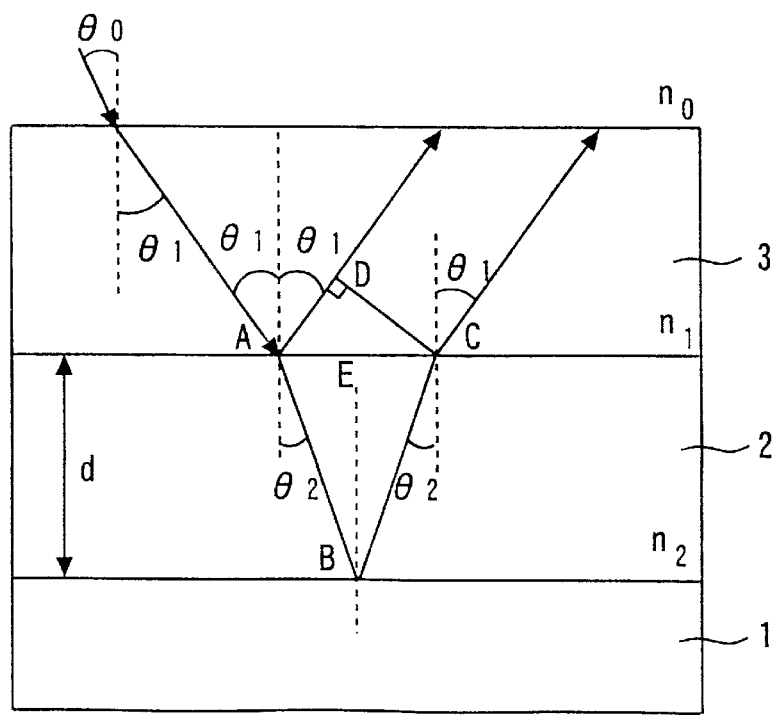

FIG. 12 is an enlarged sectional view of a boundary between an underlying film 2 and a semiconductor device 1, in which rays are made incident at an incident angle $\theta_0$ on a resist film 3 formed on the underlying film 2 having a thickness "d", and one of the rays is reflected from the front surface of the underlying film 2 and another is reflected from the bottom surface of the underlying film 2. The relationship between the ray reflected from the front surface of the underlying film 2 and the ray reflected from the bottom surface of the underlying film 2 will be described with reference to FIG. 12.

It is assumed that exposure rays (wavelength in air: $\lambda_0$) enter from air into a first medium (resist film 3) at an incident angle $\theta_0$, and that the refractive index of air is taken as $n_0$ (=1); the refractive index of the first medium is $n_1$; the refractive index of the second medium (underlying film 2) is $n_2$; the wavelength of the ray in the first medium is $\lambda_1$; and the wavelength of the ray in the second medium is $\lambda_2$.

The rays advancing through air and reaching the first medium (resist film 3) at the incident angle $\theta_0$ are refracted at the front surface of the first medium (resist film 3) when entering into the same and advance in the first medium at a refraction angle $\theta_1$. The rays thus advanced in the first medium (resist film 3) at the refraction angle $\theta_1$ are made incident on a front surface point A of the second medium (underlying film 2) at the incident angle $\theta_1$. Of the rays thus made incident on the second medium (underlying film 2), a part is refracted at the surface of the second medium (underlying film 2) when entering into the same and advances in the second medium (underlying film 2) at the refraction angle $\theta_2$. The incident ray is then totally reflected from a bottom surface point B of the second medium (underlying film 2), and reaches a front surface point C of the second medium (underlying film 2). At this time, since the reflection angle of the ray reflected from the bottom surface of the second medium (underlying film 2) is $\theta_2$, the ray is made incident on the front surface of the second medium (underlying film 2) at the angle $\theta_2$. The ray thus made incident on the front surface of the second medium (underlying film 2) at the incident angle $\theta_2$ is refracted at the front surface and advances in the first medium (resist film 3) at the refraction angle $\theta_1$ on the basis of the reversibility of refraction.

On the other hand, another part of the rays having been made incident on the front surface point A of the second medium (underlying film 2) is reflected from the front surface point A of the second medium (underlying film 2). At this time, since the incident angle of the ray at the bottom surface of the first medium (resist film 3) is $\theta_1$, the reflected ray travels in the first medium at the angle $\theta_1$ on the basis of the symmetric property of reflection.

Here, an optical path difference $\Delta d$ between optical paths of two of the exposure rays having entered in the first medium (resist film 3) is calculated. Of the two rays, one is made incident on the bottom surface of the first medium (resist film 3) at the incident angle $\theta_1$ and is reflected therefrom; and the other is made incident on the second medium (underlying film 2), being reflected from the bottom surface of the second medium (underlying film 2), and passes through the upper surface of the second medium (underlying film 2), that is, the bottom surface of the first medium (resist film 3).

As is apparent from FIG. 12, the optical paths of the two rays become identical to each other if an optical path AD of the ray reflected from the bottom surface of the first medium and an optical path (AB+BC) of the ray passing therethrough are excluded. Accordingly, a difference between the optical paths AD and (AB+BC) becomes the optical path difference $\Delta d$. That is to say, the optical path difference $\Delta d$ is given by the following equation:

$$\Delta d = (AB + BC) - AD \tag{1}$$

-continued
$$= (2 \cdot d / \cos\theta_2) - 2d \cdot n_1 / n_2 \cdot \tan\theta_2 \cos(\pi/2 - \theta_1)$$
$$= 2d(1/\cos\theta_2 - n_1/n_2 \cdot \tan\theta_2 \sin\theta_1)$$
$$= 2d(1/\cos\theta_2 - \sin\theta_2/\sin\theta_1 \cdot \sin\theta_2/\cos\theta_2 \cdot \sin\theta_1)$$
$$= 2d((1 - \sin^2\theta_2)/\cos\theta_2) = 2d\cos\theta_2$$

Since the above two rays, that is, the reflection ray and the passing ray are reflected from the points A and B, the phases of both the rays advance at the points A and B, respectively. Here, letting $\phi$ be the phase difference between both the rays, to match the phases of planes waves of both the rays with each other, a value obtained by subtracting $\phi$ from $\Delta d \cdot 2\pi n_2/\lambda_1$ should be an integral multiple of $2\pi$. Accordingly, the thickness "d" of the first medium for matching the phases of both the rays with each other is given by the equation (2).

$$2\pi n_2/\lambda_1 \times 2d \cdot \cos\theta_2 - \phi = 2\pi m \tag{2}$$

In the equation (2), "m" designates an integer equal to or more than zero. Actually, as advancing in the medium, the ray is decayed because of absorption of its optical energy by atoms constituting the medium. As a result, to obtain the stronger reflection wave of the ray, the film thickness "d" may be made thinner. Therefore, it may be desirable to set "m" at a value closer to zero.

With respect to the wavelength of the ray used at the lithography step, the relationships between $\lambda_0$ and $\lambda_1$ and between $\lambda_1$ and $\lambda_2$ are given below on the basis of the Snell's low, in which $\lambda_0$ is the wavelength of the ray in air; $\lambda_1$ is the wavelength of the ray in the first medium (resist film 3); and $\lambda_2$ is the wavelength of the ray in the second medium (underlying film 2).

$$(\sin\theta_0/\sin\theta_1) = (n_1/n_0) = (\lambda_0/\lambda_1) \tag{3}$$

$$(\sin\theta_1/\sin\theta_2) = (n_2/n_1) = (\lambda_1/\lambda_2) \tag{4}$$

From the equations (3) and (4), the wavelengths of the refraction waves in the media 1 and 2 are given by the equations (5) and (6).

$$\lambda_1 = (n_0/n_1)\lambda_0 \tag{5}$$

$$\lambda_2 = (n_1/n_2)\lambda_1 \tag{6}$$

Further, the maximum incident angle $\theta_0$ is determined by the NA (Numerical Aperture) of a projector lens present between the mask and the wafer, and is given by the equation (7).

$$NA = n_0 \sin\theta_0 \tag{7}$$

Here, examination will be made by way of an example in which a KrF excimer laser emitting rays (wavelength $\lambda_0$ in air: 248 nm) is used as a light source. It is assumed that the refractive index $n_0$ of the ray in air is 1; the refractive index $n_1$ of the ray in the first medium (resist film) is 1.8; and the refractive index $n_2$ of the ray in the second medium (silicon oxide film) is 1.45. In this case, if the numerical aperture NA=0.5, the maximum incident angle $\theta_0$=30° is obtained from the equation (7). Accordingly, an incident ray in a range of $0° \leq \theta_0 \leq 30°$ can be obtained. Hereinafter, it is assumed that $\theta_0$ is 30°. From the equation (3), the incident angle $\theta_2$=16.1° and the wavelength $\lambda_1$=137.8 nm of the ray in the resist can be obtained. Also, from the equation (4), the incident angle $\theta_2$=20.2° of the ray in the second medium (silicon oxide film) can be obtained. Now, assuming that the phase difference φ due to reflection is π and also m=0, the thickness "d" of the second medium (silicon oxide film) required for matching the above phases of both the rays with each other can be obtained by substituting $\lambda_1$=137.8 nm and $n_2$=1.45 in the equation (2). That is to say, the thickness "d" becomes 25.4 nm.

If the numerical aperture NA=0.6, $\theta_1$=19.5° is obtained from the equation (3). Accordingly, an incident ray in a range of 0°≦$\theta_1$≦19.5° can be obtained. Hereinafter, it is assumed that $\theta_1$ is 19.5°. From the equation (4), the incident angle $\theta_2$=24.40 can be obtained. Now, assuming that the phase difference φ due to reflection is π and also m=0, the thickness "d" of the second medium (silicon oxide film) required for matching the above phases of both the rays with each other can obtained from the equation (2). That is to say, the thickness "d" becomes 26.1 nm.

In this way, the thickness of the underlying film can be set such that a phase of an exposure ray reflected from the front surface of the underlying film in a specific direction is matched, at the front surface of the underlying film, with a phase of an exposure ray having been reflected from the bottom surface of the underlying film and passing through the front surface of the underlying film in the specific direction. As a result, the intensities of the exposure rays on the front surface of the underlying film, particularly, at a front surface portion of the underlying film positioned under the edge of the mask region of the mask are enhanced. This makes it possible to suppress occurrence of a taper due to the weak intensities of the exposure rays at the front surface portion of the underlying film positioned under the edge of the mask region of the mask.

To enhance the intensities of the exposure rays at the portion positioned under the edge of the mask region of the mask, the incident angle of the exposure rays made incident on the underlying film in such a state as to match the phases with each other may be preferably offset a specific angle with respect to the semiconductor substrate. The tilting angle varies depending on the numerical aperture NA of the exposure system used and the like; however, it may be generally set such that the reflection angle θ of the exposure rays reflected from the front surface of the underlying film is in a range of 0≦θ≦30°, and preferably, in a range of 10≦θ≦20° to further enhance the intensities of the exposure rays at the portion positioned under the edge of the mask region of the mask.

Figure 13:
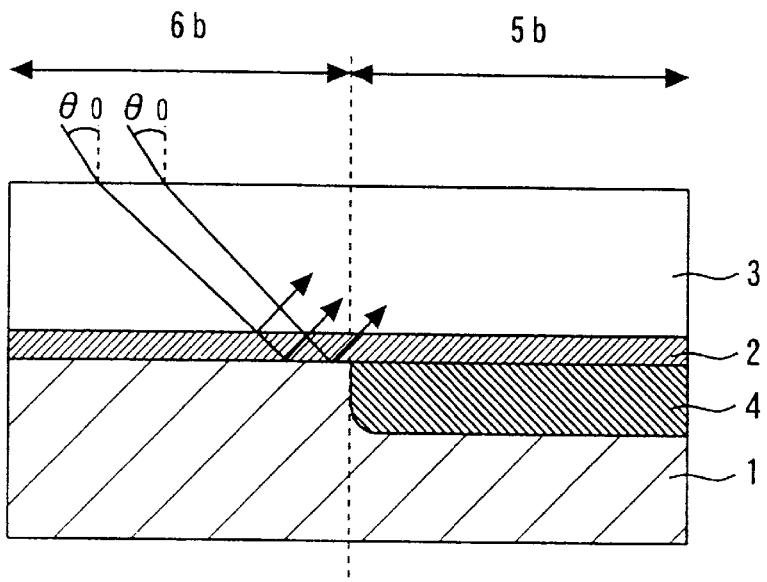

Since the incident angle of the exposure rays made incident on the underlying film in such a state as to match the phases with each other is offset a specific angle with respect to the semiconductor substrate, as shown in FIG. 13, the exposure rays made incident in the direction from the non-mask region can be effectively used to enhance the intensities of the exposure rays at the portion positioned under the edge of the mask region of the mask.

After exposure of the acid generating chemical amplification resist 3b, the substrate 1 in this state is subjected to baking treatment at about 115° C. for one minute. In addition, the temperature required for baking treatment may be in a range of 100 to 150° C.

Next, ions of boron are implanted in the substrate 1 via the resist mask 3b under conditions with an accelerating voltage of 300 keV and a dose of $10^{13}$ ions/cm$^2$, to form a P well 10, and then ions of phosphorous are implanted in the substrate 1 via the resist mask 3b under conditions with a high accelerating voltage of 2 MeV and a dose of $10^{13}$ ions/cm$^2$, to form a BN well 11 on the underside of the P well 10. In this way, the structure shown in FIG. 11 is obtained. In the structure, since the width of the taper formed at the side wall of the resist mask 3b is small, an extension portion is little formed on the BN well 11 as shown in FIG. 11.

According to the method of manufacturing a semiconductor device in this embodiment, the thickness of the underlying film is set such that a phase of an exposure ray reflected from the front surface of the underlying film in a specific direction is matched, at the front surface of the underlying film, with a phase of an exposure ray having been reflected from the bottom surface of the underlying film and passing through the front surface of the underlying film in the specific direction. Accordingly, upon exposure, a sufficient amount of the exposure rays reach the portion positioned under the edge of the mask region of the mask. This makes it possible to suppress the width of a taper formed at such a portion after development, and hence to increase the accuracy of the resist pattern.

Further, according to the method in this embodiment, a large BN extension portion is not formed at a side wall of a BN well, and accordingly, in the case of manufacturing a semiconductor device having a structure required to assure the maximum between-well breakdown voltage, it is possible to reduce the minimum distance between a contact portion and an adjacent portion of wells, and hence to reduce the chip area of the semiconductor device.

Figure 14:
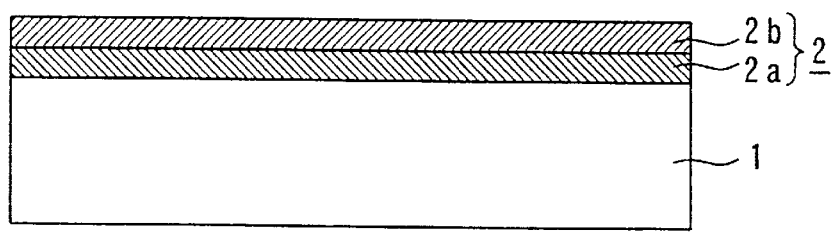

While the silicon oxide film is used as the underlying film in this embodiment, a SOG (Spin On Glass) film 2b having a low dielectric constant may be formed on the silicon oxide film 2a as shown in FIG. 14. If the refractive index of the SOG film 2b is the same as that of the silicon oxide film 2a, the total thickness of the silicon oxide film 2a and the SOG film 2b may be regarded as the thickness of the second medium, and it can be determined on the basis of the equation (2).

Fourth Embodiment

In a method of manufacturing a semiconductor device in the fourth embodiment, a reflection film having a high reflectance is used as a backing film provided under a resist film for allowing the bottom of the resist film to be sufficiently exposed to exposure rays by reflection of the exposure rays from the reflection film at the lithography step of forming a resist mask used for forming a BN well. Such a method will be described below.

Figure 15:
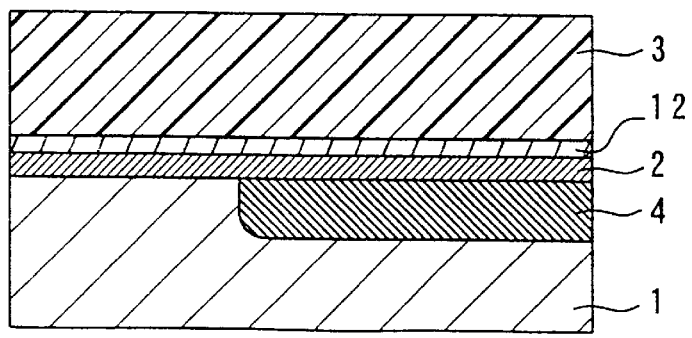
FIGS. 15 to 17 are schematic sectional views illustrating a process of manufacturing a semiconductor device in the fourth embodiment of the present invention.
Figure 16:
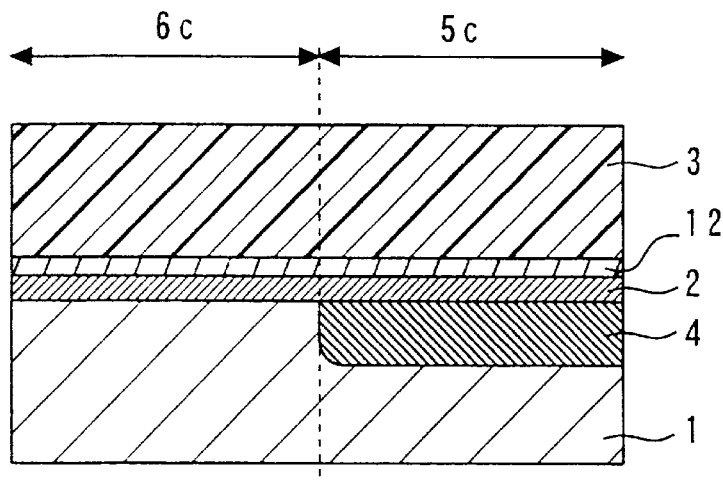
Figure 17:
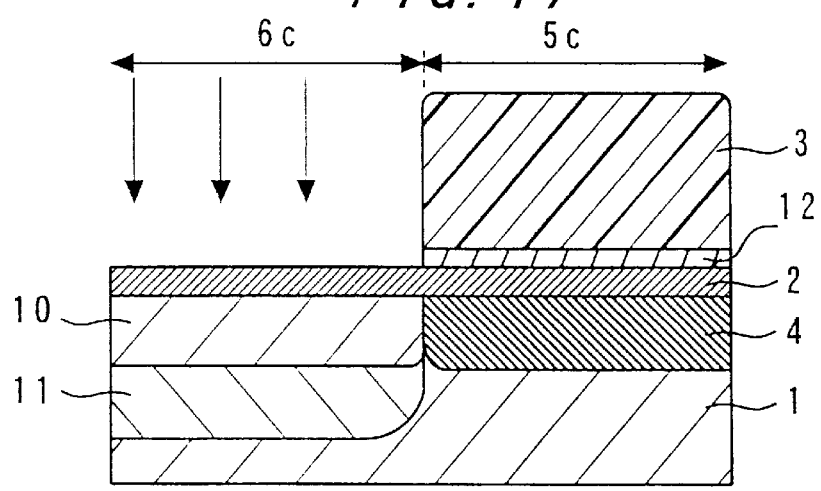

FIGS. 15 to 17 are schematic sectional views illustrating a process of manufacturing a semiconductor device in the fourth embodiment.

Like the third embodiment, an underlying film 2 is formed on a semiconductor substrate 1, and an N well 4 is formed by mask patterning and ion implantation. In addition, the thickness of the underlying film 2 may be set in the same manner as that in the third embodiment, or may be arbitrarily set.

After formation of the N well 4, as shown in FIG. 15, a reflection film 12 is formed on the underlying film 2, and then the reflection film 12 is coated with a positive type resist film 3. The reflection film 12 may be preferably made of a film having a high reflectance against exposure rays, for example, a metal film having a high reflectance. In particular, a metal film made from aluminum or copper has a high reflectance, 91.5% for aluminum and 40.4% for copper against, for example, exposure rays having a wavelength of 0.22 μm and made incident at right angles, and therefore, it may be more preferably used as the reflection film 12.

The reflection film 12 is formed to cover at least the bottom portion of the resist film 3. That is to say, the size of the reflection film 12 is set to be equal to or more than that of the resist film 3. If the reflection film 12 does not entirely cover the underside of the resist film 3, the intensities of the exposure rays largely differ on the underside of the resist film 3 between a portion covered with the reflection film 3 and a portion not covered therewith. This makes it difficult to adjust the exposure for forming accurate pattern.

Next, as shown in FIG. 16, the resist film 3 is irradiated with monochromatic rays using a mask (not shown) having a mask region 5c and a non-mask region 6c, to allow only a portion of the resist film 3 positioned under the non-mask region 6c to be exposed to the monochromatic rays. At this lithography step, the exposure rays having reached the bottom surface of the resist film 3 are reflected from the reflection film 12, to enhance the intensities of the exposure rays at the bottom surface of the resist film 3. Further, at a bottom surface portion of the resist film 3 positioned under the vicinity of the edge of the mask region 5c, the exposure rays made incident at a specific angle in the direction from the non-mask region 6c are also reflected from the reflection film 12, to further enhance the intensities of the exposure rays at the bottom surface portion of the resist film 3 positioned under the vicinity of the edge of the mask region. Accordingly, even the bottom surface portion of the resist film 3 positioned under the vicinity of the edge of the mask region can be made alkali-soluble.

After exposure of the resist film 3, the exposed portion of the resist film 3 is removed by subjecting to post baking treatment and development. Then, the portion of the reflection film 12 positioned under the non-mask region is removed by etching. In this way, the structure shown in FIG. 17 is obtained. The reason why the reflection film is partially removed is to prevent atoms constituting the reflection film from being knocked on to enter in the semiconductor substrate upon ion implantation.

The subsequent steps of forming a P well 10 and an BN well 11 are the same as those in the third embodiment, and therefore, the description thereof is omitted.

According to the method of manufacturing a semiconductor device in this embodiment, since the reflection film is formed on the semiconductor substrate and the resist film is formed on the reflection film, a sufficient amount of exposure rays reach the portion of the resist film positioned under the vicinity of the edge of the mask region. This makes it possible to suppress the width of a taper formed at such a portion after development, and hence to increase the accuracy of the resist pattern.

Further, according to the method in this embodiment, a large BN extension portion is not formed at a side wall of a BN well, and accordingly, in the case of manufacturing a semiconductor device having a structure required to assure the maximum between-well breakdown voltage, it is possible to reduce the minimum distance between a contact portion and an adjacent portion of wells, and hence to reduce the chip area of the semiconductor device.

Fifth Embodiment

In a method of manufacturing a semiconductor device in the fifth embodiment, a multi-layer film formed by alternately stacking at least two kinds of film s different in refractive index is used as a backing layer provided under a resist film for enhancing the intensities of exposure rays on the bottom surface of the resist film by multiple reflections of the exposure rays from the multi-layer film at the lithography step of forming a resist mask used for forming a BN well. Such method will be described below.

Figure 18:
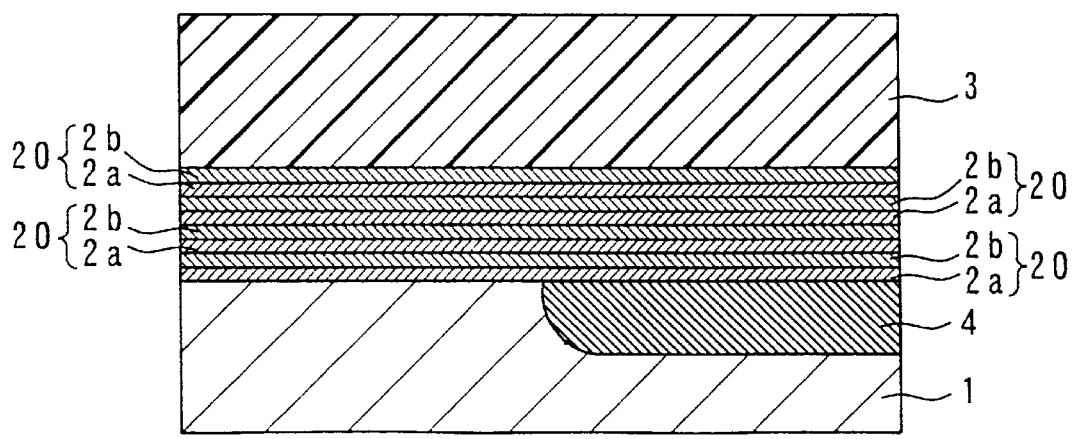
FIGS. 18 and 19 are schematic sectional views illustrating a process of manufacturing a semiconductor device in the fifth embodiment of the present invention.
Figure 19:
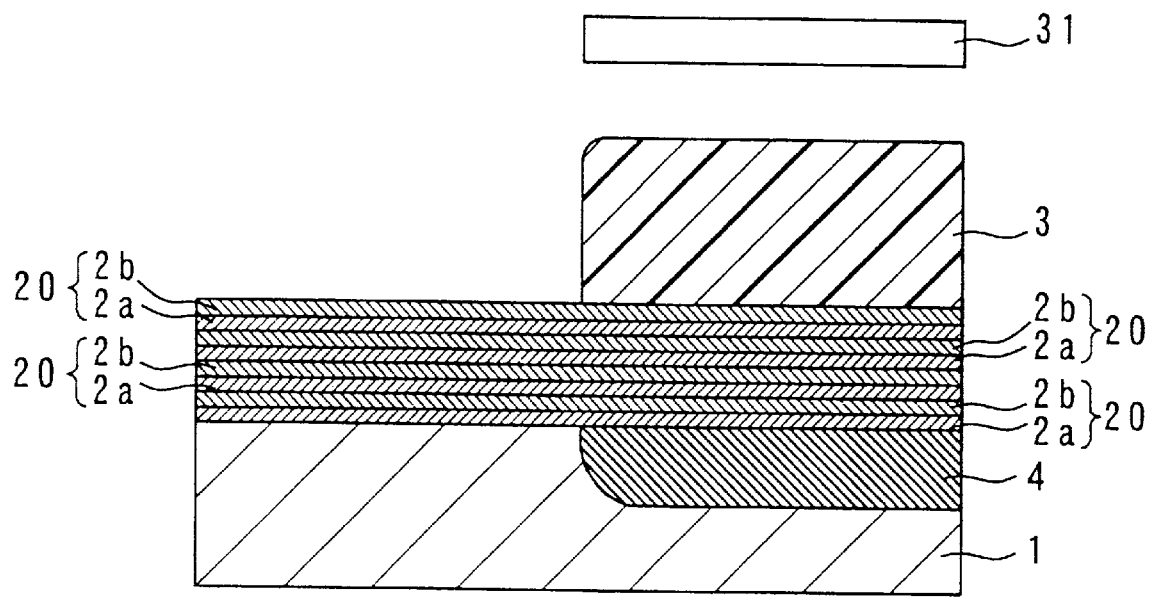
Figure 20:
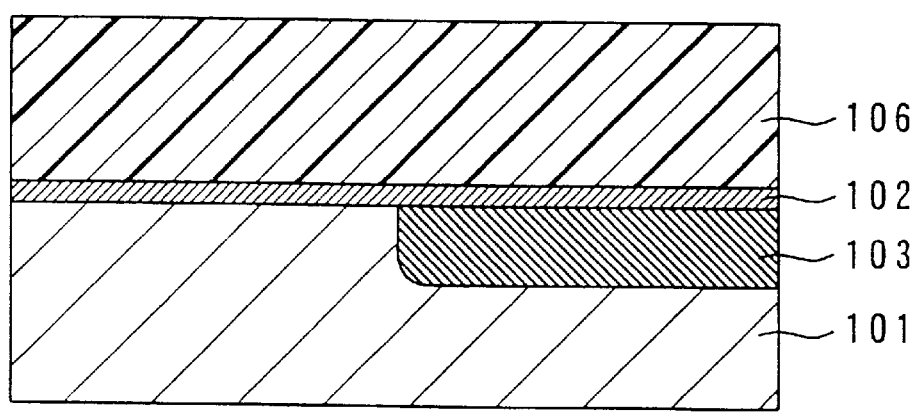
FIGS. 20 to 23 are schematic sectional views illustrating a conventional process of manufacturing a semiconductor device.
Figure 21:
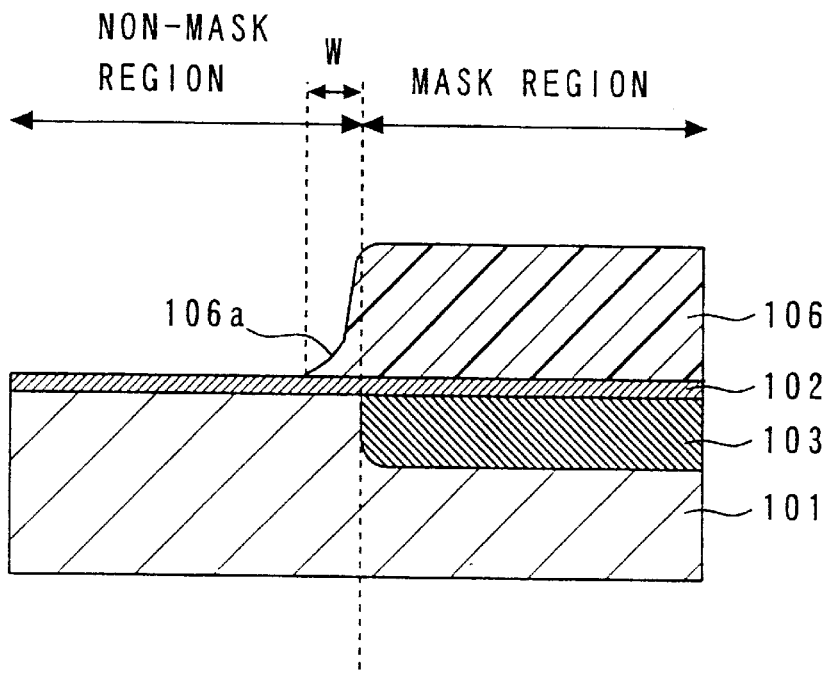
Figure 22:
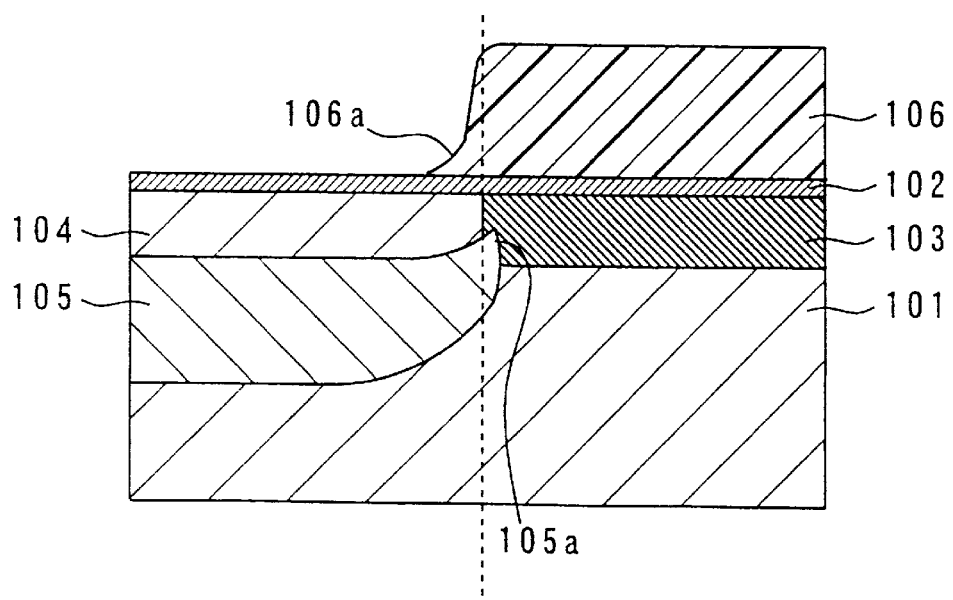
Figure 23:
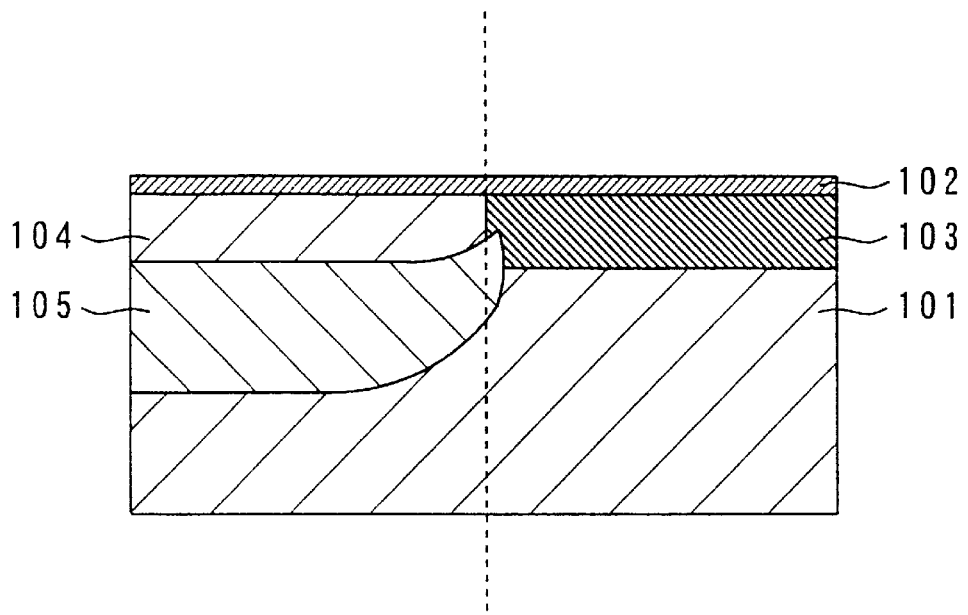
Figure 24:
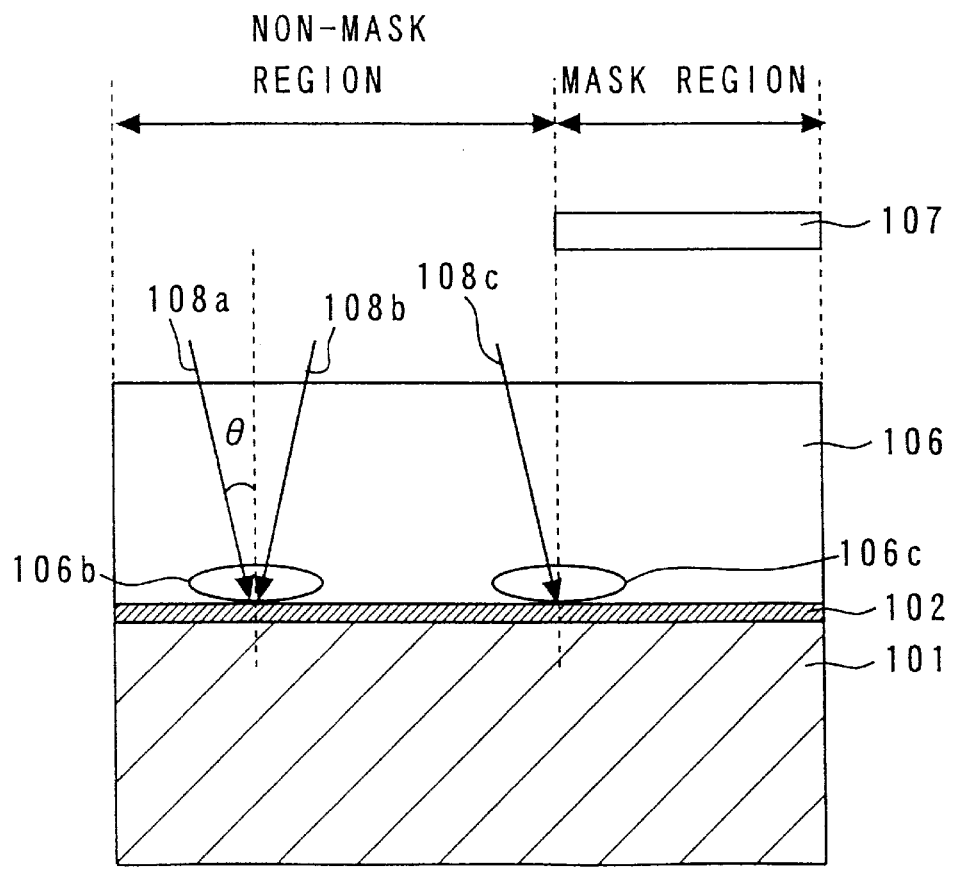
FIG. 24 is a graph illustrating intensities of incident rays at a bottom of a resist film used in the conventional process.
Figure 25:
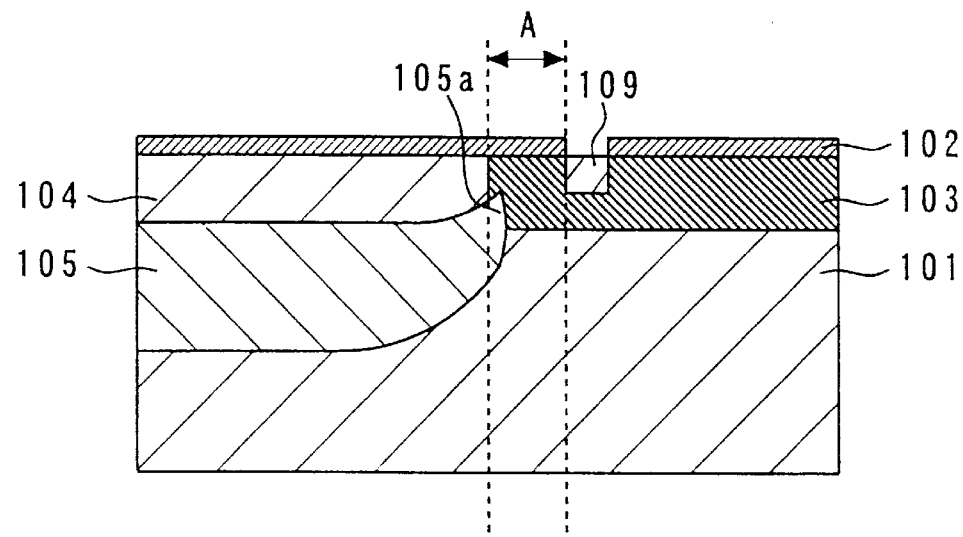
FIG. 25 is a schematic sectional view illustrating a principal portion of a conventional semiconductor device.
Figure 26:
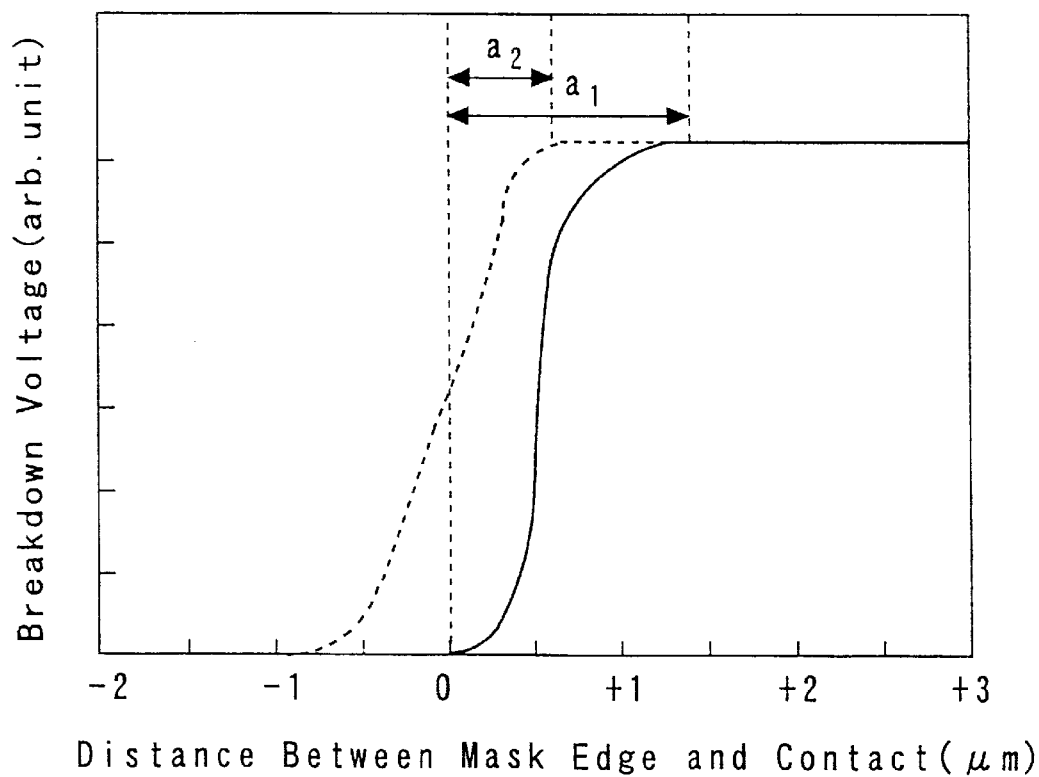
FIGS. 26 and 28 are graphs for describing a relationship between a between-well breakdown voltage and a structure of a semiconductor device.
Figure 27:
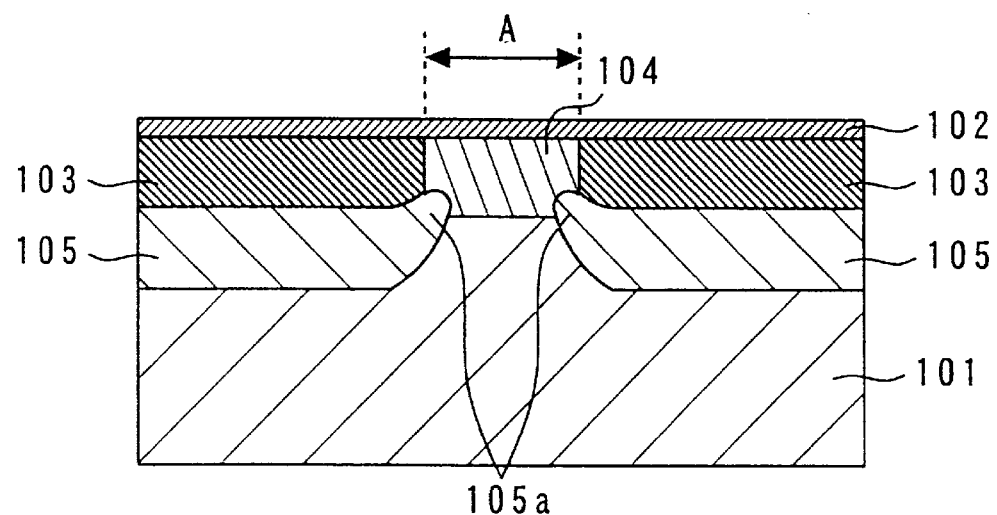
FIG. 27 is a schematic sectional view illustrating a principal portion of other conventional semiconductor device.
Figure 28:
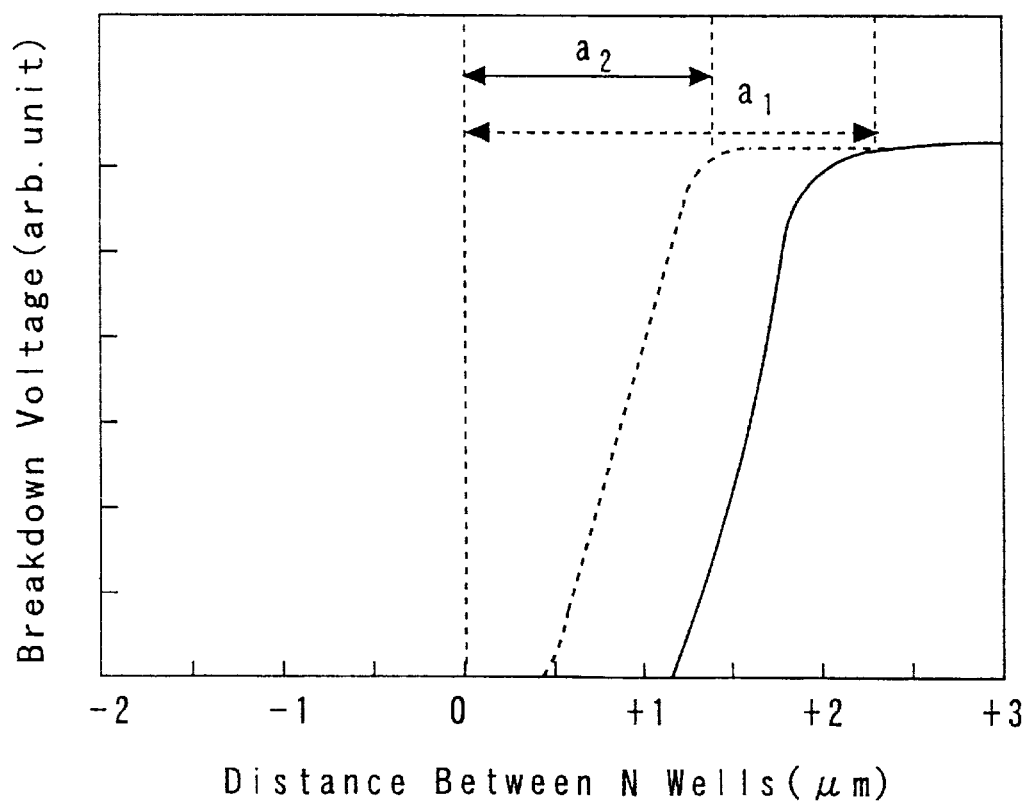

FIGS. 18 and 19 are schematically sectional views for explaining a manufacturing process of a semiconductor device in the fifth embodiment. Like the third embodiment, a film 2a is formed on a semiconductor substrate 1, and an N well 4 is formed by mask patterning and ion implantation. In addition, the thickness of the film 2a may be set in the same manner as that in the third embodiment, or may be arbitrarily set.

After formation of the N well 4, as shown in FIG. 18, another film 2b is formed on the film 2a. These two films 2a and 2b constitute one underlying film 20. A plurality (four in this embodiment) of the underlying layers 20 are stacked. The upper surface of these stacked underlying films 20 is coated with a positive type resist film 3. The films 2a and 2b constituting the underlying film 20 may be configured such that the refractive index of one film is different from that of the other film. For example, a polysilicon film may be formed on a silicon oxide film.

By stacking a plurality of films on the underside of the resist film, it is possible to enhance the intensities of exposure rays at the bottom surface of the resist film. The reason for this will be described below.

It is assumed that rays are made incident at right angles on the semiconductor substrate for better understanding. In this case, if an optical thickness of each underlying film is one-fourth of the wavelength of the incident rays, the phase of the reflection rays is matched with that of the incident rays, to enhance the intensities of the rays on the bottom surface of the resist film 3. Accordingly, it is assumed that the optical thickness of each underlying film 20 is one-half of the wavelength of incident rays. In this case, letting $\lambda_1$ be the wavelength of the rays in the resist film, the following equation (8) is given.

$$n_2 \cdot h_2 = n_3 \cdot n_3 = \lambda_1/4 \qquad (8)$$

Further, in the case where the multi-layer films are stacked by 2N times, the reflectance $R_{2N}$ of these multi-layers is given by the following equation.

$$R_{2N} = \{(1-n_4/n_1 \cdot (n_2/n_3)^{2N})/(1+n_4/n_1 (n_2/n_3)^{2N})\}^2$$

For example, it is assumed that the film 2b is a polysilicon film having a refractive index $n_2=3.45$; the film 2a is a silicon oxide film having a refractive index $n_3=1.45$; exposure rays radiated from a light source has wavelength $\lambda_0=157$ nm in air; the refractive index $n_0$ of air is 1; the refractive index $n_1$ of the resist 3 is 1.8; and the refractive index $n_4$ of the silicon substrate is 3.45. In this case, the wavelength $\lambda_1$ of the rays in the resist 3 becomes 87.2 nm from the equation (3). Using the value $\lambda_1$, the thickness $h_2$ of the film 2b becomes 6.3 nm from the equation (8), and the thickness $h_3$ of the film 2a becomes 15 nm from the equation (8).

TABLE 1

Multiple reflectance of Multi-layer Film

| N | reflectance |
|---|---|
| 1 | 0.69 |
| 2 | 0.967 |
| 3 | 0.997 |
| 4 | 0.9997 |

Table 1 shows respective reflectances of the underlying film s stacked in the above conditions with the stacked number N changed from 1 to 4. As shown in Table 1, the reflectance becomes larger with an increase in the stacked number N. To be more specific, exposure raysare multi-raysreflected from respective film s constituting the multi-rayslayer underlying film provided on the underside of the resist film 3. Accordingly, the reflectance on the bottom portion of the resist film 3 can be made closer to 1 by adjusting the thickness of each film. This makes it possible to enhance the intensities of the exposure rays on the bottom portion of the resist film 3.

After formation the resist film 3 on the plurality of underlying films 20, using a mask 31 having a mask region and a non-mask region, a portion of the resist film 3 positioned under the non-mask region is exposed to exposure rays. Upon this exposure, part of the exposure rays having reached the bottom surface of the resist film 3 is made incident on the plurality of underlying films 20 each being composed of the films 2a and 2b, and is reflected therefrom. The reflection rays are then collected to the bottom surface of the resist film 3, to thereby enhance the intensities of the exposure rays on the bottom surface of the resist film. Further, at a bottom surface portion of the resist film 3 positioned under the vicinity of the edge of the mask region, the exposure rays made incident at a specific angle in the direction from the non-mask region are also reflected from the underlying films 20, to further enhance the intensities of the exposure rays at the bottom surface portion of the resist film 3 positioned under the vicinity of the edge of the mask region. Accordingly, even the bottom surface portion of the resist film 3 positioned under the vicinity of the edge of the mask region can be made alkali-soluble.

After exposure of the resist film 3, the substrate 1 in this state is subjected to post baking treatment and development. In this way, the structure shown in FIG. 19 is obtained. Then, a P well and a BN well are formed in accordance with the same manner as that described in the third embodiment.

According to the method of manufacturing a semiconductor device in this embodiment, since a plurality of underlying films each being composed of a plurality of films are stacked on the semiconductor substrate, a sufficient amount of exposure rays reach the portion of the resist film positioned under the vicinity of the edge of the mask region. This makes it possible to suppress the width of a taper formed at such a portion after development, and hence to increase the accuracy of the resist pattern.

Further, according to the method in this embodiment, a large BN extension portion is not formed at a side wall of a BN well, and accordingly, in the case of manufacturing a semiconductor device having a structure required to assure the maximum between-well breakdown voltage, it is possible to reduce the minimum distance between a contact portion and an adjacent portion of wells, and hence to reduce the chip area of the semiconductor device.

A plurality of the underlying layers are stacked in this embodiment; however, the present invention is not limited thereto. The above effect can be obtained by forming only one underlying film. Further, the underlying film is composed of the two films in this embodiment; however, the number of the films constituting the underlying film may be set at two or more.

In the above first to fifth embodiments, the method of making small the width of a taper on a side wall of the resist mask is applied to the formation of a bottom well; however, the present invention is not limited thereto. For example, the method can be effectively applied to formation of other semiconductor elements such as a well, a gate of a transistor, a via-hole, and a contact-hole.

The major benefits of the present invention described above are summarized as follows:

According to the present invention, there is provided a method of manufacturing a semiconductor device, including the steps of: forming a first resist mask having an opening portion of a specific pattern on a semiconductor substrate, the opening portion having a side wall formed with a taper portion; forming a water-soluble resist film on the first resist mask in such a manner as to cover at least the taper portion, the water-soluble resist film being made water-insoluble when it reacts with acid; allowing the water-soluble resist film to react with acid, to form a water-insoluble portion on the taper portion; removing the water-soluble resist film while leaving the water-insoluble portion, to form a second resist mask composed of the water-insoluble portion formed on the taper portion and the first resist mask; and implanting an impurity in the semiconductor substrate via the second resist mask, to form an impurity region in the semiconductor substrate. Accordingly, it is possible to make small the width of a taper formed on a side wall of the second resist, and hence to increase the accuracy of the resist pattern.

In the case where the first resist mask is made from an acid generating chemical amplification resist, it is not required to supply acid to the second resist film for reaction therebetween. Accordingly, it is possible to form the second resist mask with the reduced number of steps.

Further, in this case, it is easy to supply acid only to the portion of the resist film positioned on the first resist mask. Accordingly, it is possible to form the crosslinking portion only on the first resist mask.

In the case where acidic ions are implanted in the second resist film to allow the second resist film to react with the acidic ions, it is possible to easily control the amount of the acid implanted in the second resist film and hence to make small a variation in dimension of a crosslinking portion formed by reaction with the acid.

In the case where the step of forming an impurity region includes the steps of forming a well in a surface layer of a semiconductor device and forming a bottom well on the underside of the well, it is possible to reduce an extension portion formed at a side wall of the bottom well. Accordingly, in the case of manufacturing a semiconductor device having a structure required to assure the maximum between-well breakdown voltage, it is possible to reduce the minimum distance between an element and an adjacent portion of wells, and hence to reduce the chip area of the semiconductor device.

According to the present invention, there is also provided a method of manufacturing a semiconductor device, including the steps of: forming an underlying film on a semiconductor substrate; forming a resist film on the underlying film; exposing the resist film to exposure rays having a specific wavelength, to form a mask having a specific pattern; and implanting an impurity in the semiconductor substrate via the mask, to form an impurity region in the semiconductor substrate; wherein the thickness of the underlying layer is set such that upon exposure, a phase of an exposure ray reflected from the front surface of the underlying film in a specific direction is matched, at the front surface of the underlying film, with a phase of an exposure ray having been reflected from the bottom surface of the underlying film and passing through the front surface of the underlying film in the specific direction. Accordingly, a sufficient amount of the exposure rays reach the portion positioned under the edge of the mask region of the mask. This makes it possible to suppress the width of a taper formed at such a portion after development, and hence to increase the accuracy of the resist pattern.

According to the present invention, there is also provided a method of manufacturing a semiconductor device, including the steps of: forming an underlying film on a semiconductor substrate; forming a resist film on the underlying film ; exposing the resist film to exposure rays, to form a mask having a specific pattern; and implanting an impurity in the semiconductor substrate via the mask, to form an impurity region in the semiconductor substrate; wherein the reflectance of the underlying film is set such that the bottom portion of the resist film is exposed to the exposure rays reflected from the underlying film upon exposure. Accordingly, it is possible to enhance the intensities of exposure rays on the bottom portion of the resist film, and hence to suppress the width of a taper formed on a side wall of the resist mask.

In the case where the underlying film is configured as a metal film, the exposure rays are reflected from the metal film upon exposure, and thereby the intensities of the exposure rays on the bottom portion of the resist film can be enhanced.

In the case where the underlying film is formed by stacking a plurality of layers each being composed of at least two films different in refractive index, the intensities of the exposure rays on the bottom portion of the resist film can be enhanced by the reflected rays from respective films.

Further, the present invention is not limited to these embodiments, but variations and modifications may be made without departing from the scope of the present invention.

The entire disclosure of Japanese Patent Application No. H11-121408 filed on Apr. 28, 1999 including specification, claims, drawings and summary are incorporated herein by reference in its entirety.

What is claimed is:

1. A method of manufacturing a semiconductor device, comprising the steps of:

forming a first resist mask having an opening portion of a specific pattern on a semiconductor substrate, said opening portion having a side wall formed with a taper portion;

forming a water-soluble resist film on said first resist mask in such a manner as to cover at least said taper portion, said water-soluble resist film being made water-insoluble when it reacts with acid;

allowing said water-soluble resist film to react with acid, to form a water-insoluble portion on said taper portion;

removing said water-soluble resist film while leaving said water-insoluble portion, to form a second resist mask composed of said water-insoluble portion formed on said taper portion and said first resist mask; and implanting an impurity in said semiconductor substrate via said second resist mask, to form an impurity region in said semiconductor substrate.

2. The method of manufacturing a semiconductor device according to claim 1, wherein said water-soluble resist film is made from a mixture of a water-soluble resin and a water-soluble crosslinking agent, said mixture generating a crosslinking reaction under the presence of acid functioning as catalyst.

3. The method of manufacturing a semiconductor device according to claim 2, wherein said water-soluble resin is selected from the group consisting of polyacrylic acid, polyvinyl acetal, polyvinyl pyrrolidone, polyvinyl alcohol, polyethylene imine, polyethylene oxide, styrene-maleic anhydride copolymer, polyvinyl amine, polyallyl amine, an oxazoline base containing water-soluble resin, a water-soluble melamine resin, a water-soluble urea resin, an alkyd resin, and sulfonamide.

4. The method of manufacturing a semiconductor device according to claim 2, wherein said water-soluble crosslinking agent is selected from the group consisting of a melamine based crosslinking agent, a urea based crosslinking agent, and an amino based crosslinking agent.

5. The method of manufacturing a semiconductor device according to claim 1, wherein the thickness of said first resist mask is in a range of 1 to 5 $\mu$m.

6. The method of manufacturing a semiconductor device according to claim 1, wherein said first resist mask is made from an acid generating chemical amplification resist.

7. The method of manufacturing a semiconductor device according to claim 1, wherein said first resist mask is coated with an acid source material.

8. The method of manufacturing a semiconductor device according to claim 1, wherein a water-insoluble portion is formed on said taper portion by implanting acid ions in said resist film.

9. The method of manufacturing a semiconductor device according to claim 1, wherein said step of implanting an impurity in said semiconductor substrate to form said impurity region comprises the steps of forming a well in a surface layer of said semiconductor substrate and forming a bottom well on the underside of said well.

* * * * *